United States Patent
Park et al.

(10) Patent No.: US 9,536,605 B2
(45) Date of Patent: Jan. 3, 2017

(54) RESISTIVE MEMORY DEVICE AND OPERATING METHOD

(71) Applicant: SAMSUNG ELECTRONICS CO., LTD., Suwon-Si, Gyeonggi-Do (KR)

(72) Inventors: Hyun-Kook Park, Anyang-Si (KR); Yeong-Taek Lee, Seoul (KR); Dae-Seok Byeon, Seongnam-Si (KR); Bo-Geun Kim, Gyeonggi-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/806,780

(22) Filed: Jul. 23, 2015

(65) Prior Publication Data

US 2016/0125939 A1    May 5, 2016

(30) Foreign Application Priority Data

Oct. 29, 2014    (KR) .................. 10-2014-0148456

(51) Int. Cl.
| | | |
|---|---|---|
| *G11C 11/00* | (2006.01) | |
| *G11C 13/00* | (2006.01) | |
| *G11C 11/56* | (2006.01) | |
| *G11C 11/16* | (2006.01) | |

(52) U.S. Cl.
CPC ......... *G11C 13/004* (2013.01); *G11C 11/5607* (2013.01); *G11C 11/5678* (2013.01); *G11C 11/5685* (2013.01); *G11C 13/0061* (2013.01); *G11C 11/1673* (2013.01); *G11C 2013/0054* (2013.01); *G11C 2213/71* (2013.01); *G11C 2213/77* (2013.01)

(58) Field of Classification Search
CPC . G11C 13/0069; G11C 13/0004; G11C 11/16; G11C 11/15; G11C 11/5678; G11C 11/5642
USPC ...................................... 365/148, 163, 205
See application file for complete search history.

(56) References Cited

U.S. PATENT DOCUMENTS

| | | | |
|---|---|---|---|
| 6,785,156 | B2 | 8/2004 | Baker |
| 6,885,580 | B2 | 4/2005 | Baker |
| 6,954,392 | B2 | 10/2005 | Baker |
| 7,151,689 | B2 | 12/2006 | Baker |

(Continued)

FOREIGN PATENT DOCUMENTS

| | | |
|---|---|---|
| KR | 20050119161 A | 12/2005 |
| KR | 20140091961 A | 7/2014 |

OTHER PUBLICATIONS

Ielmini, D. et al., "Physical interpretation, modeling and impact on phase change memory (PCM) reliability of resistance drivt due to chalcogenide structural relaxation," 2007 IEEE, pp. 939-942.

(Continued)

*Primary Examiner* — Huan Hoang
(74) *Attorney, Agent, or Firm* — Volentine & Whitt, PLLC

(57) ABSTRACT

Provided are a resistive memory device including a plurality of memory cells, and a method of operating the resistive memory device. The resistive memory device includes a sensing circuit connected to a first signal line, to which a memory cell is connected, the sensing circuit sensing data stored in the memory cell based on a first reference current; and a reference time generator for generating a reference time signal that determines a time point when a result of the sensing is to be output, based on the first reference current.

13 Claims, 23 Drawing Sheets

(56) References Cited

U.S. PATENT DOCUMENTS

| | | |
|---|---|---|
| 7,818,638 B2 | 10/2010 | Baker |
| 7,869,253 B2 | 1/2011 | Liaw et al. |
| 7,876,598 B2 * | 1/2011 | Schroegmeier ..... G11C 11/5614 |
| | | 365/148 |
| 8,098,512 B2 | 1/2012 | Parkinson et al. |
| 8,274,849 B2 | 9/2012 | Bauser |
| 8,422,281 B2 | 4/2013 | Cuppens |
| 8,503,220 B2 | 8/2013 | Kim et al. |
| 8,675,413 B2 | 3/2014 | Baker |
| 8,705,306 B2 | 4/2014 | Lowrey et al. |
| 2010/0124101 A1 | 5/2010 | Park et al. |
| 2014/0119095 A1 * | 5/2014 | Lee ..................... G11C 13/004 |
| | | 365/148 |
| 2014/0169069 A1 | 6/2014 | Oh |
| 2014/0198556 A1 | 7/2014 | Lee et al. |

OTHER PUBLICATIONS

Ielmini, Daniele, "Rcovery and Drift Dynamics of Resistance and Threshold Voltages in Phase-Change Memories," IEEE Transactions on Electron Devices, Vo. 54, No. 2, Feb. 2007, p. 308-315.

* cited by examiner

|        | READ1 | READ2 | READ3 |
|--------|-------|-------|-------|
| State0 | 1     | 1     | 1     |
| State1 | 0     | 1     | 1     |
| State2 | 0     | 0     | 1     |
| State3 | 0     | 0     | 0     |

RESISTIVE MEMORY DEVICE AND OPERATING METHOD

CROSS-REFERENCE TO RELATED APPLICATIONS

This application claims the benefit of Korean Patent Application No. 10-2014-0148456 filed on Oct. 29, 2014, the subject matter of which is hereby incorporated by reference.

BACKGROUND

The inventive concept relates generally to memory devices, and more particularly, to resistive memory devices and methods of operating same.

Continuing demand for memory devices providing high data storage capacity and low power consumption drives research into next-generation, nonvolatile memory devices. It is desired that next-generation memory devices have the high memory cell integration density of dynamic random access memory (DRAM), the nonvolatile data storage capabilities of flash memory, and the high data access speed of static RAM (SRAM). Next-generation memory devices include, for example, the phase-change RAM (PRAM), Nano-floating-gate memory (NFGM), polymer RAM (PoRAM), magnetic RAM (MRAM), ferroelectric RAM (FeRAM), and resistive RAM (RRAM).

SUMMARY

The inventive concept provides a method of operating a resistive memory device capable of increasing a sensing margin and reducing power consumption when performing a read operation, and a method of operating the resistive memory device.

According to an aspect of the inventive concept, there is provided a resistive memory device including: a sensing circuit connected to a first signal line, to which a memory cell is connected, the sensing circuit sensing data stored in the memory cell based on a first reference current flowing through the first signal line; and a reference time generator for generating a reference time signal that determines a time point when a result of the sensing is to be output, based on the first reference current.

The sensing circuit may include: a first current source providing the first reference current to the first signal line; a first capacitor connected to the first signal line; and a sense amplifier for comparing a first reference voltage with a voltage of the first signal line in response to the reference time signal, and outputting a result of the comparing.

The reference time generator may include: a second current source for generating a second reference current based on the first reference current; a second capacitor charged by the second reference current; and a comparator for comparing a second reference voltage with a voltage of the second capacitor, and outputting a result of the comparing as the reference time signal.

The second current source may output the second reference current that is $\alpha$ times greater than the first reference current (where $0<\alpha<1$).

A capacitance of the first capacitor and a capacitance of the second capacitor may be substantially equal to each other.

The first reference voltage and the second reference voltage may be equal to each other.

A time taken for the first capacitor to be charged to a voltage level of the first reference voltage by using the first reference current may be shorter than a time taken for the second capacitor to be charged to a voltage level of the second reference voltage by using the second reference current.

The second capacitor may be a parasitic capacitor of the first signal line.

The reference time generator may be connected to a first dummy signal line in a memory cell array that includes the memory cell, and the second capacitor may be a parasitic capacitor of the first dummy signal line.

The sensing circuit may sense the data stored in the memory cell by performing a read operation a plurality of times, and the reference time generator may provide the sensing circuit with a plurality of reference time signals by changing a current value of the second reference current according to a number of times the read operation is performed.

According to an aspect of the inventive concept, there is provided a resistive memory device including: a sensing circuit for sensing data stored in a memory cell based on a reference current, and outputting a result of the sensing as data of at least two-bits in response to at least two reference time signals that are activated at different time points from each other; and a reference time generator including at least two reference time generation circuits operating based on the reference current, and generating the at least two reference time signals.

The sensing circuit may include: a first current source for providing the reference current to a first signal line that is connected to the memory cell; a sense amplifier for comparing a reference voltage with a voltage of the first signal line and outputting a result of the comparing; and at least two latches receiving the result of the comparing from the sense amplifier, and outputting data in response to a reference time signal respectively corresponding to each of the at least two latches between the at least two reference time signals.

The at least two latches may include a first latch, a second latch, and a third latch, wherein the first latch may output a first bit data in response to a first reference time signal, the second latch may output a second bit data in response to a second reference time signal, and the third latch may output a third bit data in response to a third reference time signal.

The at least two reference time generation circuits may generate the at least two reference time signals based on at least two currents generated from the reference current according to two different current reduction ratios.

The at least two reference time generation circuits may generate the at least two reference time signals based on at least two threshold resistance levels that classify resistance states of the memory cell.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
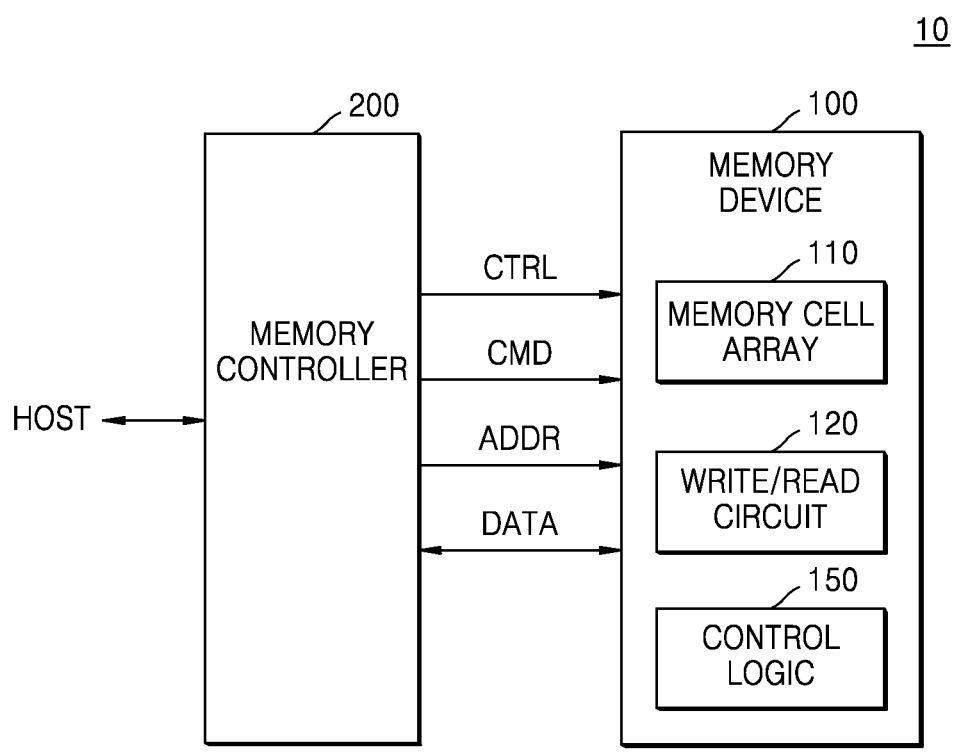
FIG. 1 is a block diagram of a memory system including a resistive memory device according to an embodiment of the inventive concept.

The inventive concept will now be described in some additional detail with reference to the accompanying drawings in which certain embodiments of the inventive concept are shown. The inventive concept may, however, be embodied in many different forms, and should not be construed as being limited to only the illustrated embodiments. Throughout the written description and drawings like reference numbers and labels are used to denote like or similar elements. In the drawings, the dimension of certain structures may have been exaggerated for clarity.

Furthermore, all examples and conditional language recited herein are to be construed as being not limited to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

Figure (FIG. 1 is a block diagram of a memory system 10 including a resistive memory device 100 according to an embodiment of the present inventive concept.

Referring to FIG. 1, the memory system 10 includes the resistive memory device 100 (hereinafter, "the memory device") and a memory controller 200. The memory device 100 generally includes a memory cell array 110, a write/read circuit 120, and control logic 150. The memory device 100 may further include circuits performing write and read operations directed to selected memory cells of the memory cell array 110 under the control of the control logic 150. Since the memory cell array 110 includes resistive memory cells the memory system 10 may be referred to as a resistive memory system.

In response to write/read requests received from a host, the memory controller 200 causes data to be written to or read from the memory device 100. In this regard, the memory controller 200 may provide one or more address(es) ADDR, command(s) CMD, and/or control signal(s) CTRL to the memory device 100 to control the execution of read, write and/or erase operation(s). As the result of read/write operations data DATA will be communicated between the memory controller 200 and memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and Integrated Drive Electronics (IDE).

The memory cell array 110 includes a plurality of memory cells (not shown) that are respectively disposed at points where a first signal line crosses a second signal line. Here, first signal lines may be bit lines and second signal lines may be word lines, or vice verses. Each of the memory cells may be a single level cell (SLC) that stores one bit data, or may be a multilevel cell (MLC) that may store at least two-bit data. Alternatively, the memory cell array 110 may include both the SLC and the MLC. When one bit data is written to one memory cell, the memory cells may have two resistance level distributions according to the written data. Alternatively, for example, when two-bit data is written to one memory cell, the memory cells may have four resistance level distributions according to the written data. However, MLC may be configured to store three or more data bits in certain embodiments of the inventive concept.

In FIG. 1, it is assumed that the memory cell array 110 includes memory cells arranged in a two-dimensional (2D) or horizontal structure. However, other embodiments may include a memory cell array 110 may including memory cells arranged in a three-dimensional (3D) or vertical structure.

The memory cell array 110 may be logically divided into a plurality of cell regions according to various criteria. For example, respective cell regions may be defined as page units including a number of memory cells connected to the same word line. Other bit line and/or word line related definitions of memory cell array regions may be used. In addition, the word lines may be connected to one row decoder (or a row selection block) and the bit lines may be connected to one column decoder (or a column selection block), and the above-described cell region may be defined as a tile.

The memory cell array 110 may include resistance-type memory cells or resistive memory cells that include a variable resistor device (not shown) having a variable resistor. As one example, when resistance of the variable resistor device that is formed of a phase change material (e.g., Ge—Sb—Te) is changed according to a temperature, a resistive memory device may be a phase change RAM (PRAM). As another example, when the variable resistor device is formed of complex metal oxide including an upper electrode, a lower electrode, and transition metal oxide there-between, the resistive memory device may be a resistive RAM (RRAM). As another example, when the variable resistor device is formed of an upper electrode of a magnetic material, a lower electrode of the magnetic material, and a dielectric there-between, the resistive memory device may be a magnetic RAM (MRAM). Hereinafter, it will be assumed that the memory cell array 110 is an RRAM.

The write/read circuit 120 performs write and read operations on the memory cells. The write/read circuit 120 is connected to the memory cells via the bit lines, and may include a write driver that writes data to the memory cells, and a sense amplifier that amplifies data read from the memory cells.

The control logic unit 150 may generally control the execution of various operations associated with the memory device 100, and may control the write/read circuit 120 during execution of (e.g.,) read/write operations. For example, the memory device 100 may include a power generation unit (not shown) for generating various write voltages and read voltages used in the writing and read operations, and levels of the write and read voltages may be adjusted according to control of the control logic 150.

When executing a write operation on the memory device 100, a level of the variable resistance of the memory cell in the memory cell array 110 may increase or decrease according to the written data. For example, each of the memory cells in the memory cell array 110 may have a resistance level corresponding to currently stored data, and the resistance level of each memory cell may increase or decrease according to the data to be written. This type of write operation may be classified as a "reset write operation" or a "set write operation". In a resistive memory cell, a "set" state may have a relatively low resistance level, while a "reset" state may have a relatively high resistance level. Thus, a reset write operation may be performed to increase the level of the variable resistance, while a set write operation may be performed to decrease the resistance level of the variable resistance.

During a read operation, a voltage apparent at a sensing node (e.g., a signal line connected to a selected memory cell) is compared with a reference voltage to determine the state (or value) of stored data. In one embodiment using a current sensing approach, a reference current is applied to the selected memory cell and a resulting voltage at the sensing node is compared with a reference voltage in order to determine the data state. Here, the data state determination result may vary depending on a sensing point where the voltage of the sensing node is compared with the reference voltage. If the resistance level of the memory cell or a capacitance of the signal line to which the memory cell is connected varies depending on process and/or temperature variations, the data determination result may change or corresponding sensing margin be decreased in accordance with the nature and/or location of the sensing point.

With reference to the memory device 100 of FIG. 1, a reference time that is variable with change(s) in process and/or temperature may be set, and data may be sensed at the set reference time in order to increase sensing margin. Accordingly, data may be read when it is stable and without regard to possible changes in process and/or temperature. Also, based on the reference time, data may be sensed before necessarily stabilizing the voltage apparent at the sensing node. This result provided by embodiments of the inventive concept reduces overall power consumption by a memory system.

In certain embodiments, the memory controller 200 and memory device 100 may be integrated into a semiconductor device. For example, the memory controller 200 and the memory device 100 may be integrated to the semiconductor device and thus may configure a memory card. As one example, the memory controller 200 and the memory device 100 may be integrated to the semiconductor device and thus may configure a PC card (a PCMCIA card), a compact flash card (CF card), a smart media card (SM/SMC), a memory stick, a multimedia card (MMC, RS-MMC, or MMCmicrO, a secure digital (SD) card (SD, miniSD, or microSD), or universal flash storage (UFS). As another example, the memory controller 200 and the memory device 100 may be integrated to the semiconductor device and thus may configure a Solid State Disk/Drive (SSD).

Figure 2:
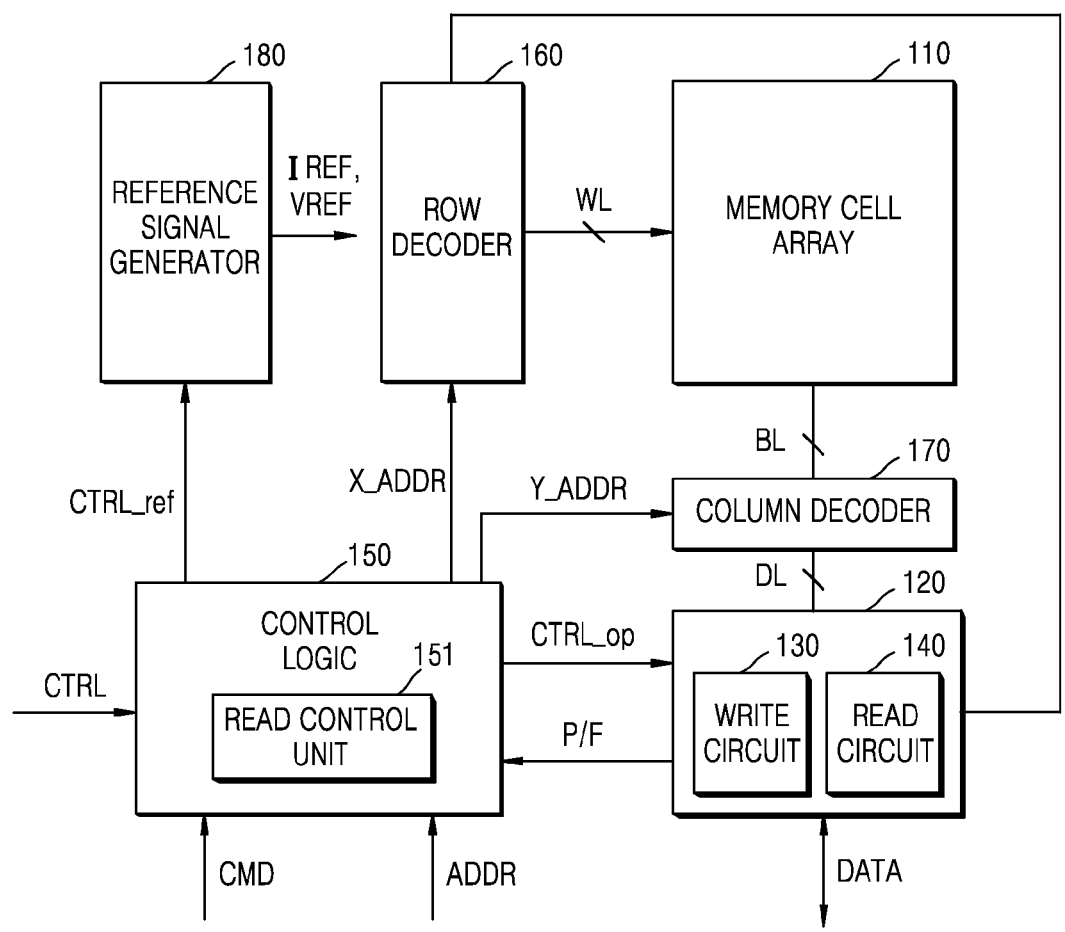
FIG. 2 is a block diagram showing an example of the memory device of FIG. 1.

FIG. 2 is a block diagram further illustrating in one example the memory device 100 of FIG. 1.

Referring to FIG. 2, the memory device 100 includes the memory cell array 110, write/read circuit 120, and control logic unit 150, as well as a reference signal generator 180, a row decoder 160 and a column decoder 170, wherein the write/read circuit 120 includes a write circuit 130 and a read circuit 140.

The memory cell array 110 includes a plurality of first signal lines and a plurality of second signal lines, as well as memory cells respectively disposed at points in the memory cell array 110 where a first signal line crosses a second signal line. It is assumed here that the first signal lines are bit lines BL and the second signal lines are word lines WL.

An address ADDR for indicating an access-target memory cell may be received. The address ADDR may include a row address X_ADDR for selecting a word line of the memory cell array 110, and a column address Y_ADDR for selecting a bit line of the memory cell array 110. The row decoder 160 may select at least one of the word lines in response to the row address X_ADDR. The column decoder 170 may select a bit line selection operation in response to the column address Y_ADDR.

The write/read circuit 120 may connected to the bit line BL via the column decoder 170 to write data in the memory cell or to read data from the memory cell. The write/read circuit 120 may write data DATA input from outside to the memory cell array 110 or sense and output the data written in the memory cell array 110, according to control of the control logic 150. Also, the write/read circuit 120 may provide the control logic 150 with writing or reading result. For example, the write/read circuit 120 performs a verification operation for detecting a result of the write operation when performing the write operation, and may provide the control logic 150 with the verification result, for example, pass or fail information P/F.

The write/read circuit 120 may be connected to the bit lines BL or the lines WL to write data in the memory cell or to read data from the memory cell. For example, the write/read circuit 120 is connected to the selected bit line BL or the selected word line WL to provide the selected memory cell with a program pulse to perform the programming operation (that is, write operation). As such, the data DATA to be stored may be written in the memory cell array 110. Here, the program pulse may be referred to as a write pulse. In one or more embodiment, the program pulse may be a current pulse. In another embodiment, the program pulse may be a voltage pulse.

In particular, the write circuit 130 may perform the set write operation for programming a selected memory cell so that the resistance of the memory cell is decreased. Also, the write circuit 130 may perform the reset write operation for programming the memory cell so that the resistance of the memory cell is increased.

The read circuit 140 is connected to the bit line BL via the column decoder 170, and may sense the resistance level of the selected memory cell to read the stored data DATA. As such, the data DATA stored in the memory cell array 110 may be output.

In particular, the read circuit 140 may perform a general read operation on the memory cell MC in a case where a read command is transmitted from the memory controller 200. Also, the read circuit 140 may perform a pre-read operation for reading an initial resistance status of the memory cell in advance by performing a read operation on the memory cell, before performing a write operation on the memory cell MC.

Moreover, the read circuit 140 may perform a verifying read operation for determining whether a write operation directed to a selected memory cell has been successfully completed.

During a read operation, generally, the read circuit 140 provides read data to an external circuit (e.g., the memory controller 200). Also, during a pre-read operation and a verifying read operation, the read circuit 140 provides read data, and/or pass/fail information (P/F) indicating whether the read/write operation was successfully completed to an internal circuit of the memory device 100 (e.g., control logic 150 or write circuit 130).

In addition, the read circuit 140 may apply a reference current (IREF) to a signal line connected to a selected memory cell, in accordance with certain current sensing methods, and may compare the resulting voltage at a sensing node with a reference voltage VREF in order to determine a state of the stored data. Here, the read circuit 140 sets the reference time that is variable in accordance with one or more environmental, process and/or temperature related variances. Thus, a reference time may be set to a point in time earlier than a point at which the voltage apparent at the sensing node has completely settled.

In certain embodiments, the read circuit 140 may include a reference time generator having a similar structure to that of the sensing circuit, where the reference time generator is connected to a signal line that is itself connected to the selected memory cell (e.g., a bit line BL or a word line WL). In this manner, the sensing circuit may be used to sense data in response to a reference time signal provided by the reference time generator.

In this regard, the reference time generator may be used to generate at least two reference time signals that set at least two sensing points. Thus, the sensing circuit may be used to sense data at the at least two reference time points in relation to multi-bit data stored in MLC.

The reference signal generator 180 may be used to generate the reference voltage VREF and/or reference current IREF as various reference signals related to the data read operation. For example, a sense amplifier (not shown) included in the read circuit 140 may be connected to a node (e.g., the sensing node) of the bit line BL in order to determine data value during a read operation, where the data value is read in relation to a comparison between the sensing voltage at the sensing node and the reference voltage VREF. Also, when a current sensing method is used, the reference signal generator 180 may be used to generate a reference current IREF and provide the reference current IREF to the memory cell array 110. Thus, the data value may be read by comparing the voltage at the sensing node induced by the reference current IREF with the reference voltage VREF.

The control logic 150 provides various control signals used during the execution of read/write operations in response to command(s) CMD, address(es) ADDR, and control signal(s) CTRL received from the memory controller 200. The various control signals provided by the control logic unit 150 may be provided to the write/read circuit 120, reference signal generator 180, row decoder 160, and column decoder 170. In this manner the control logic unit 150 may control overall operation of the memory device 100.

The control logic unit 150 may provide the write/read circuit 120 with various operation control signals CTRL_op. Also, the control logic unit 150 may provide the row decoder 160 with a row address X_ADDR, and may provide the column decoder 170 with a column address Y_ADDR. Moreover, the control logic unit 150 may control the writing and read operations of the memory cell array 110 with reference to the pass or fail information P/F transmitted from the write/read circuit 120.

According to one embodiment, the control logic 150 may include a read control unit 151. The read control unit 151 may provide signals for controlling the read circuit 140 in consideration of the writing result, the reading result, or the reading environment so that the read circuit 140 may stably determine the data. For example, the read control unit 151 analyzes resistance distribution of the memory cells based on the writing result or the reading result, and may generate a control signal, for example, a reference control signal CTRL_ref, for determining the reading conditions capable of increasing the read margin, for example, the reference voltage VREF and the reference current IREF, according to the analyzing result.

Figure 3:
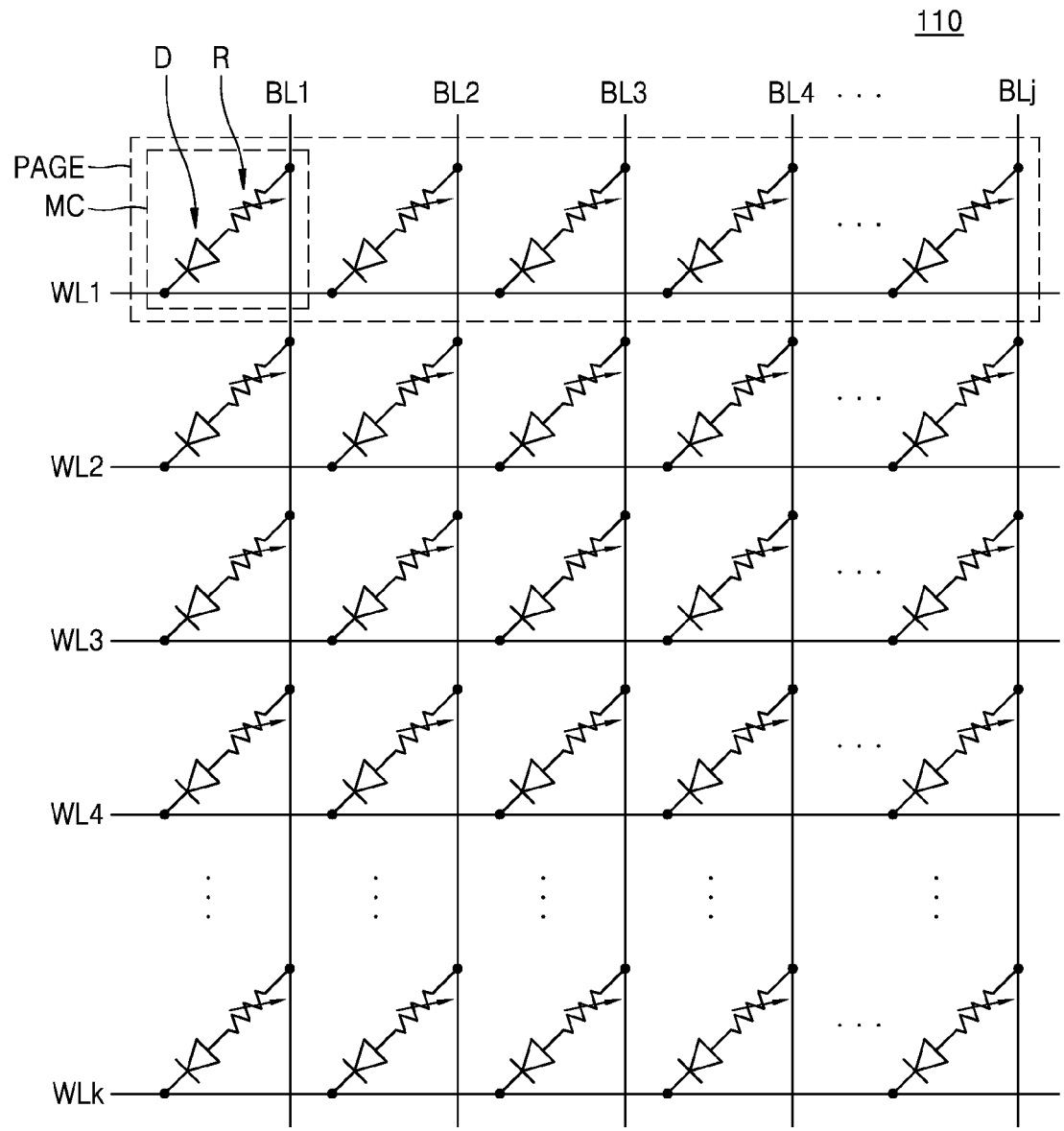
FIG. 3 is a circuit diagram of a memory cell array shown in FIG. 2.

FIG. 3 is a circuit diagram illustrating in part the memory cell array 110 of FIG. 2. The memory cell array 110 of FIG. 2 may include a plurality of memory blocks, however, and FIG. 3 shows only one memory block, as an example.

Referring to FIG. 3, the memory cell array 110 may include the memory cells of a horizontal structure. The memory cell array 110 may include a plurality of word lines WL1 through WLk, a plurality of bit lines BL1 through BLj, and a plurality of memory cells MCs. Here, the number of word lines WL, the number of bit lines BL, and the number of memory cells MC may vary depending on embodiments. Also, a group of the memory cells MC selected by the same word line WL may be defined as a page PAGE.

According to the present embodiment, each of the plurality of memory cells MC may include a variable resistive device R and a selection device D. Here, the variable resistance device R may be referred to as a variable resistance material, and the selection device D may be referred to as a switching device.

In the present embodiment, the variable resistance device R is connected between one of the plurality of bit lines BL1 through BLj and the selection device D, and the selection device D may be connected between the variable resistance device R and one of the plurality of word lines WL1 through WLk. However, the one or more embodiments of the present inventive concept are not limited thereto, that is, the selection device D may be connected between one of the plurality of bit lines BL1 through BLj and the variable resistance device R, and the variable resistance device R may be connected between the selection device D and one of the plurality of word lines WL1 through WLk.

According to various embodiments of the inventive concept, the variable resistance device R may be switched to one of a plurality of resistance states by an electric pulse applied thereto. In the present embodiment, the variable resistance device R may include a phase-change material, a crystallization status of which varies depending on an amount of electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may have an amorphous state having a relatively high resistance and a crystalline state having a relatively low resistance. The phase of the phase-change material may be changed by Joule's heat generated according to the amount of electric current. In addition, the data may be written by using the phase change.

In addition, according to another embodiment of the present inventive concept, the variable resistance device R may include perovskite compounds, transmission metal oxide, magnetic materials, ferromagnetic materials, or anti-ferromagnetic materials, instead of the phase-change material.

The selection device D may be connected between one of the plurality of word lines WL1 through WLk, and the variable resistance material R, and may control supply of the electric current to the variable resistance device R according to a voltage applied to the connected word line and the bit line. In the present embodiment, the selection device D may be a PN junction diode or a PIN junction diode. An anode of selection device D may be connected to the variable resistance device R and a cathode of the diode may be connected to one of the plurality of word lines WL1 through WLk. Here, if a voltage difference between the anode and the cathode of the diode becomes greater than a threshold voltage of the diode, the diode is turned on so as to supply the electric current to the variable resistance device R. In FIG. 3, the selection device D is shown as a diode; however, one or more embodiments of the inventive concept are not limited thereto, that is, the selection device D may be another device that may be switched.

Figure 4:
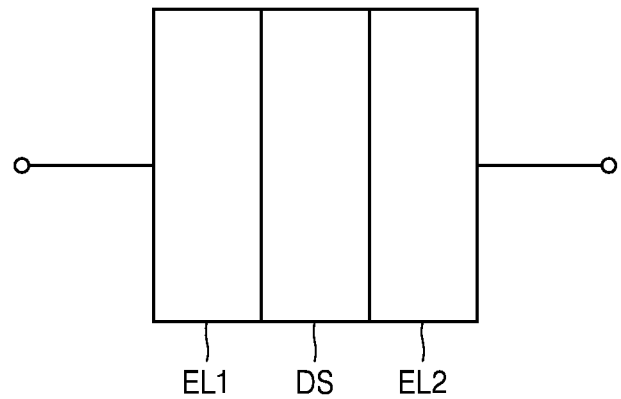
FIG. 4 is a diagram showing an example of a variable resistive device included in a memory cell shown in FIG. 3.

FIG. 4 is a diagram illustrating in one example the variable resistance device R of the memory cell MC of FIG. 3.

Referring to FIG. 4, the variable resistance device R includes first and second electrodes EL1 and EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 5A:
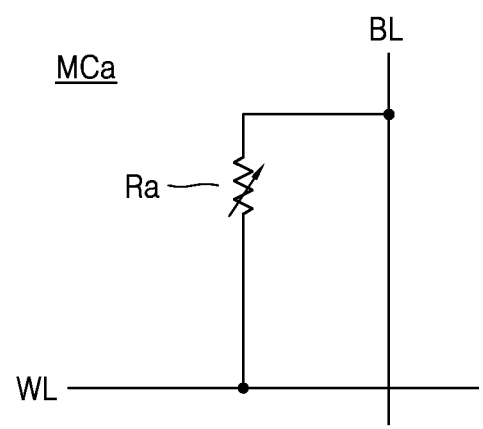
FIGS. 5A through 5C are circuit diagrams showing modified examples of the memory cell of FIG. 3.
Figure 5B:
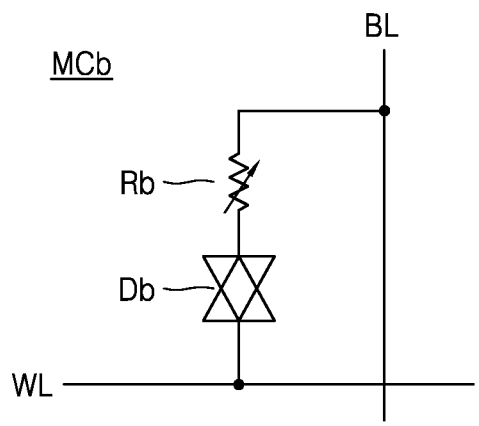
Figure 5C:
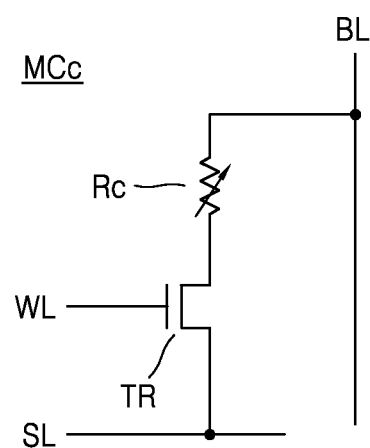

FIGS. 5A, 5B and 5C are respective circuit diagrams illustrating examples of the memory cell MC shown in FIG. 3.

Referring to FIG. 5A, a memory cell MCa includes a variable resistance device Ra, and the variable resistance device Ra may be connected between a bit line BL and a word line WL. The memory cell MCa may store data by using voltages applied to the bit line BL and the word line WL.

Referring to FIG. 5B, a memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in non-selected resistor cells may be blocked by the bidirectional diode Db.

Referring to FIG. 5C, a memory cell MCc may include a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may be selected or may not be selected according to turning on/turning off of the transistor TR that is driven by the word line WL.

Figure 6A:
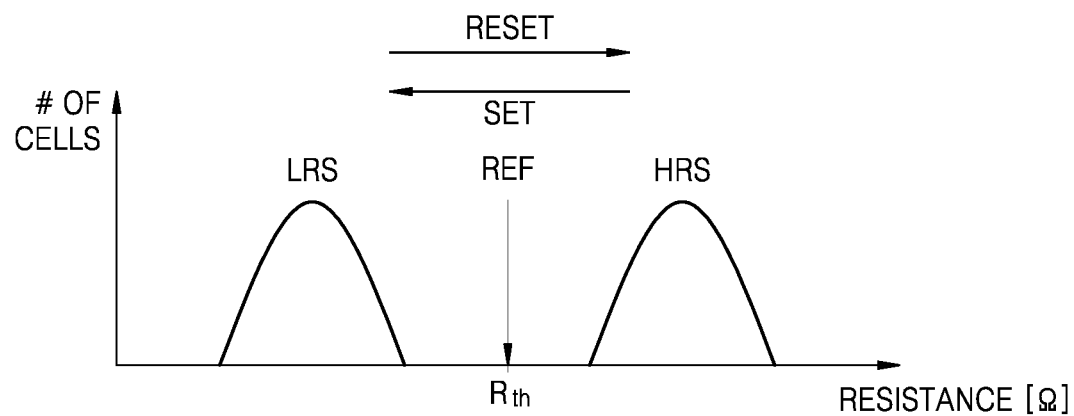
FIGS. 6A and 6B are graphs of resistance distribution of memory cells.
Figure 6B:
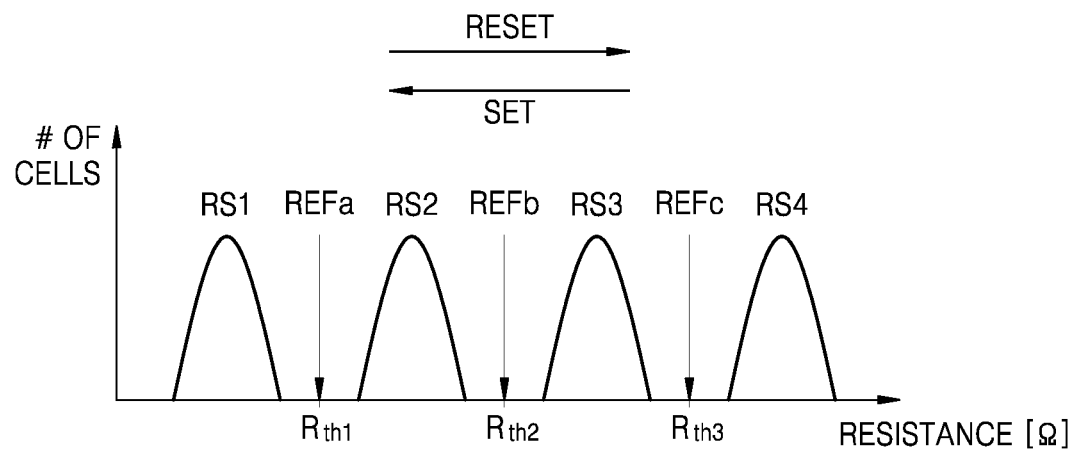

FIGS. 6A and 6B are graphs illustrating resistance distributions for the memory cells MC of FIG. 3. FIG. 6A shows a case where the memory cell MC is a SLC, and FIG. 6B shows a case where the memory cell MC is a MLC. In FIGS. 6A and 6B, a horizontal axis indicates a resistance, and a vertical axis indicates the number of memory cells MC.

Referring to FIG. 6A, if the memory cell MC is a single level cell SLC programmed with one bit, the memory cell MC may have a low resistance state LRS or a high resistance state HRS.

An operation of switching the HRS to the LRS of the memory cell MC by applying a write pulse to the memory cell MC is a set operation or a set write operation. Also, an operation of switching the MC from the LRS to the HRS by applying a write pulse to the memory cell MC is a reset operation or a reset write operation.

In the context, the resistance state may be classified as the HRS and the LRS based on a threshold resistance level Rth. The low resistance state LRS may be referred to as a set state, and the high resistance state HRS may be referred to as a reset state. The low resistance state LRS and the high resistance state HRS may respectively correspond to one of data '0' and data '1'.

The resistance level R may increase from data '0' to data '1'. The low resistance state LRS may correspond to data '0' and the high resistance state HRS may correspond to data '1'.

During a read operation directed to the memory cells MC, the high resistance state HRS is detected (or determined) when the read result is equal to or greater than the threshold resistance Rth, whereas the low resistance state LRS is determined when the read result is equal to or less than the threshold resistance.

Information about reading reference REF corresponding to the threshold resistance Rth may be communicated from the memory controller 200. The control logic 150 may set a reading condition according to information about the reading reference, and the reading condition may include information about at least one of the voltage, current, and the control signal provided to the read circuit 130 or the reference signal generator 180.

Referring to FIG. 6B, if the memory cell MC is a MLC programmed with two bits, a resistance value of the memory cell MC may have one of a first resistance state RS1, a second resistance state RS2, a third resistance state RS3, and a fourth resistance state RS4.

However, embodiments of the inventive concept are not limited to only SLC and 2-bit MLC. In certain embodiments, the memory cells MC may be programmed with 3 or more data bits.

Since the multi-level cell MLC has narrower intervals between resistance distributions than those of the single level cell SLC, a read error may occur due to a small variation in the resistance. Therefore, the resistance states RS1, RS2, RS3, and RS4 may have resistor ranges that do not overlap with each other in order to ensure a read margin.

Each of the first, second, third, and fourth resistance states RS1, RS2, RS3, and RS4 may correspond to one of data '00', data '01', data '10', and data '11'. In the present embodiment, the resistance level R may increase in order of the data '11', the data '01', the data '00', and the data '10'.

That is, the fourth resistance state RS4 may correspond to the data '11', the third resistance state RS3 may correspond to the data '01', the second resistance state RS2 may correspond to the data '00', and the first resistance state RS1 may correspond to the data '10'.

An arbitrary resistance between the distribution according to the first resistance state RS1 and the distribution according to the second resistance state RS2 is set as a first threshold resistance Rth1, an arbitrary resistance between the distribution according to the second resistance state RS2 and the distribution according to the third resistance state RS3 is set as a second threshold resistance Rth2, and an arbitrary resistance between the distribution according to the third resistance state RS3 and the distribution according to the fourth resistance state RS4 is set as a third threshold resistance Rth3. In the read operation on the memory cells MC, if the read result is equal to or greater than the first threshold resistance Rth1, it is determined that the resistance state is one of second to fourth resistance states RS2, RS3, and RS4, and if the read result is less than the first threshold resistance Rth1, the resistance state is determined as the first resistance state RS1.

Here, information about the reading references REFa, REFb, and REFc corresponding to the first to third threshold resistances Rth1, Rth2, and Rth3 may be transmitted from the memory controller 200. The control logic 150 may set the reading conditions according to the information about the reading references REFa, REFb, and REFc, and the reading conditions may include information about at least one of the voltage, the current, and the control signal applied to the read circuit 140.

FIG. 6A or FIG. 6B shows ideal distributions for the memory cells MC. In actual distributions, a relatively narrow valley may be generated between adjacent resistance states, and corresponding sensing margins will not be large. Also, one or more distribution(s) may be shifted as a whole by variations in temperature and/or processes.

Figure 7:
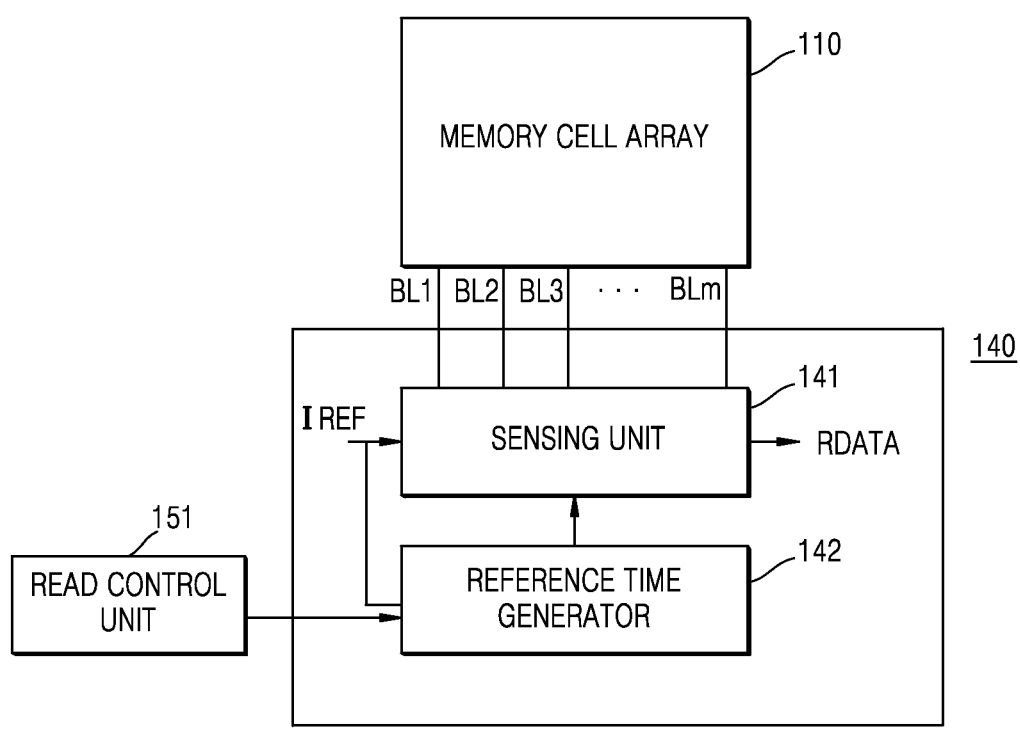
FIG. 7 is a block diagram of a read circuit according to an embodiment of the inventive concept.

FIG. 7 is a block diagram further illustrating the read circuit 140 in conjunction with a read control unit 151 according to an embodiment of the inventive concept.

Referring to FIG. 7, the read circuit 140 includes a sensing unit 141 and a reference time generator 142. The sensing unit 141 is connected to the signal lines of the memory cell array 110 (e.g., bit lines BL1 to BLj or the word lines—not shown) to sense voltages apparent on the signal lines in order to determine the data stored in the selected memory cell. The sensing unit 141 determines the data stored in the selected memory cell and provide corresponding read data RDATA.

The sensing unit 141 may include a plurality of sensing circuits (not shown) corresponding to the signal lines, where each of the sensing circuits is connected to at least one signal line. Each sensing circuit may sense the data stored in a memory cell based on the reference current IREF using a current sensing method. According to one embodiment, the reference current IREF may be externally provided or generated by the reference signal generator 180. (See, FIG. 2). Here, the phrase "applying the reference current IREF" denotes forcing or sourcing of the externally provided reference current IREF, or applying a bias voltage for generating a current having the same current amount as that of the reference current IREF. Alternately, the phrase may denote internally generating the reference current IREF.

The reference time generator 142 may receive the reference current IREF, and generate the reference time signal indicating a reference time based on the reference current IREF. Thereafter, the reference time signal is provided to the sensing unit 141. Here, the reference time denotes a time point at which a particular sensing circuit of the sensing unit 145 will sense the data during execution of a read operation. Thus, the reference time generator 142 determines the sensing point, generates a signal indicating the sensing point as the reference time signal, and provides the reference time signal to the sensing unit 141.

As described above with reference to FIG. 2, the read control unit 151 may be used to provide signals controlling the operation of the read circuit 140 in response to a write result, a read result, environmental/process/temperature variations, such that the read circuit 140 is able to stably determine the read data. In this regard, the read control unit 151 may be internally disposed within the read circuit 140.

The read circuit 140 according to various embodiments of the inventive concept will be described in some additional detail with reference to FIGS. 8 through 18, inclusive.

Figure 8:
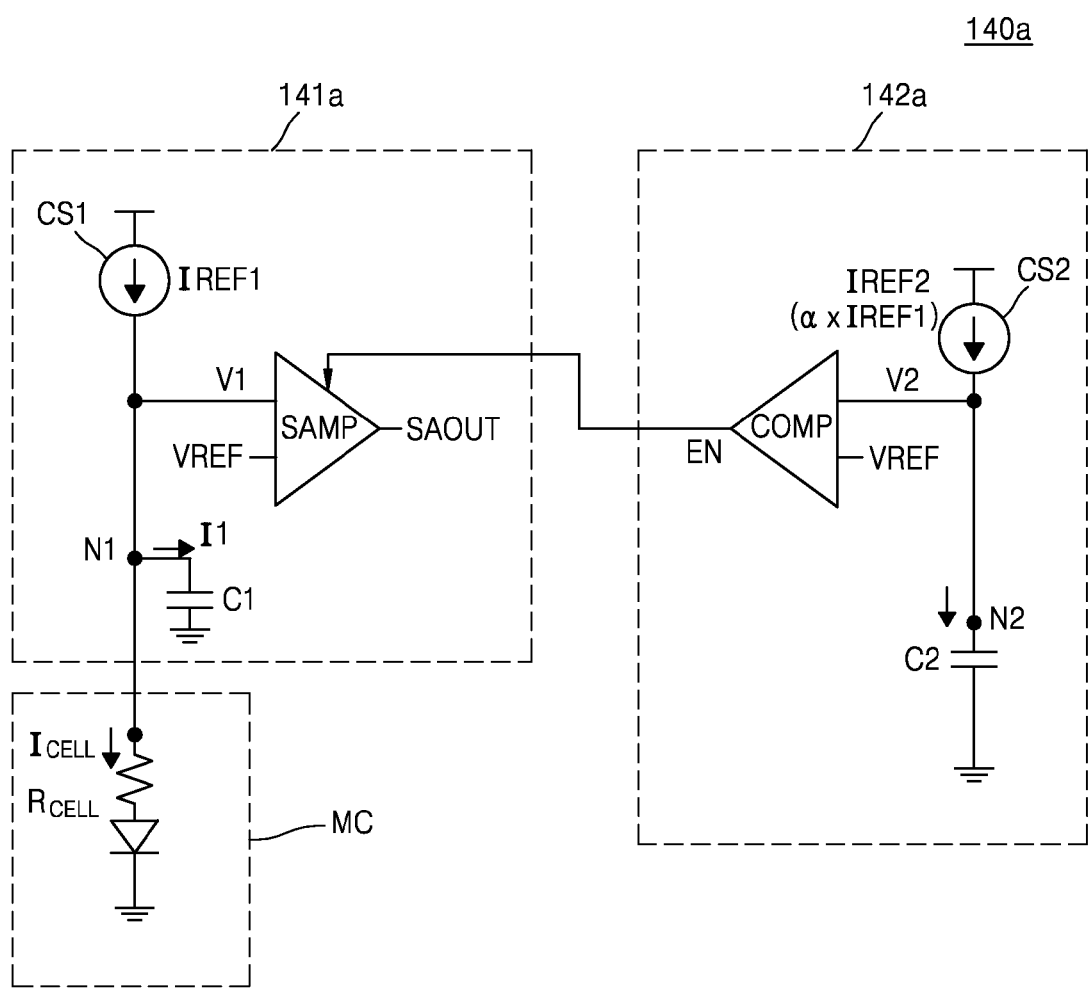
FIG. 8 is a circuit diagram showing an example of a read circuit according to an embodiment of the inventive concept.

FIG. 8 is a circuit diagram illustrating in one example a read circuit 140a according to an embodiment of the inventive concept.

Referring to FIG. 8, the read circuit 140a includes a sensing circuit 141a and a reference signal generator 142a. Only one sensing circuit 141a and corresponding memory cell MC are shown in FIG. 8 for convenience of description. In actual implementations, the read circuit 140a will usually include a plurality of sensing circuit 141a connected to a plurality of bit lines of the memory cell array 110.

The sensing circuit 141a is connected to the bit line BL to which the memory cell MC is connected in order to determine the data stored by the memory cell MC by sensing a sensing node N1 associated with the bit line BL based on the first reference current IREF1. The first reference current IREF1 may be substantially equal to the reference current IREF described with reference to FIG. 7.

The sensing circuit 141a may sense the data of the memory cell MC according to the current sensing method. The sensing circuit 141a may include a first current source CS1, a first capacitor C1, and a sense amplifier SAMP.

In one embodiment, the first capacitor C1 may be a parasitic capacitor of the bit line BL. In another embodiment, the first capacitor C1 may be a capacitor disposed in or out of the memory cell array 110 for sensing data.

The first current source CS1 generates the first reference current IREF1 and provides the first reference current IREF1 to the first capacitor C1. The first capacitor C1 may be connected to the first signal line, for example, the bit line BL, and when the first capacitor C1 is charged, the voltage at the sensing node N1, for example, a first voltage V1, may rise. The sense amplifier SAMP may compare the first voltage V1 with the reference voltage VREF, and may output the comparison result.

The first reference current IREF1 charges the first capacitor C1 to increase the voltage V1 at the sensing node N1. Here, a part of the first reference current IREF1 flows through the memory cell MC as a cell current $I_{CELL}$, and remaining current I1 of the first reference current IREF1 may charge the first capacitor C1. A resistance level of the cell resistance $R_{CELL}$ in a case where the memory cell MC is in the set state is lower than the resistance level of the cell resistance $R_{cELL}$ in a case where the memory cell MC is in the reset state. Therefore, a current value of the cell current $I_{CELL}$ when the memory cell MC is in the set state may be greater than that of the cell current $I_{CELL}$ when the memory cell MC is in the reset state. A speed of increasing the first voltage V1 may vary depending on the resistance level of the cell resistance $R_{CELL}$ of the memory cell MC. The increasing speed of the first voltage V1 when the memory cell MC is in the reset state is faster than the increasing speed of the first voltage V1 when the memory cell MC is in the set state.

With this configuration, the current sensing circuit 141a compares the first voltage V1 with the reference voltage VREF and output the comparison result in response to the reference time signal EN. The reference time signal EN is a signal indicating the sensing point at which data is sensed, and may be an enable signal for activating the sensing circuit 141a. The point in time at which the reference time signal EN is activated may be set in consideration of the increasing speed of the first voltage V1. As described above, since the increasing speeds when the memory cell MC is in the set state and in the reset state are different from each other, when the first voltage V1 is compared with the reference voltage VREF at the reference time point, the voltage level of the first voltage V1 is lower than that of the reference voltage VREF if the memory cell MC is in the set state, the voltage level of the first voltage V1 may be greater than that of the reference voltage VREF if the memory cell MC is in the reset state. Therefore, the data of the memory cell MC may be determined according to a result of comparing the first voltage V1 with the reference voltage VREF.

The reference time generator 142a may generate the reference time signal EN indicating the data sensing point for the sensing circuit 141a based on the first reference current IREF1. In the illustrated embodiment of FIG. 8, generating of the reference time signal EN denotes that the reference time signal EN is activated, that is, a logic level of the reference time signal EN enters a first level (e.g., a logical y 'high'). The reference time generator 142a may be a circuit similar to the sensing circuit 141a.

The reference time generator 142a may include a second capacitor C2, a second current source CS2 providing a second reference current IREF2 to the second capacitor C2, and a comparator COMP comparing a voltage of the second capacitor C2, for example, a second voltage V2, with the reference voltage VREF, and outputting a comparison result.

The second current source CS2 may generate a second reference current IREF2 that is α times greater than the first reference current IREF1 (0<α<1). That is, a current value of the second reference current IREF2 may be less than that of the first reference current IREF1.

The second current source CS2 may generate the second reference current IREF2 based on the first reference current IREF1. For example, the second current source CS2 may be a current mirroring circuit of the first current source CS1. The second current source CS2 may generate the second reference current IREF2 by α times mirroring the first reference current IREF1.

As another example, the first current source CS1 and the second current source CS2 may commonly receive the reference current IREF or the bias voltage applied from the outside, for example, the reference signal generator 180, and may respectively generate the first reference current IREF1 and the second reference current IREF2. Accordingly, the second reference current IREF2 and the first reference current IREF1 may be correlated with each other.

The second reference current IREF2 charges the second capacitor C2 to raise the voltage at the second node N2, for example, the second voltage V2. The second capacitor C2 may have the same capacitance as that of the first capacitor C1, but is not limited thereto. The capacitance of the second capacitor C2 may be different from that of the first capacitor C1. In this case, the capacitances of the second capacitor C2 and the first capacitor C1 may be changed at the same ratio when the process or the temperature is changed.

In one embodiment, the second capacitor C2 may be a dummy signal line disposed in the memory cell array 110, for example, a dummy bit line. Dummy memory cells may be connected to the dummy bit line, and the dummy memory cells may be electrically separated from the dummy bit line when the data read operation is performed.

In another embodiment, the second capacitor C2 is an independent capacitor included in the reference time generator 142a, and may be disposed in the memory cell array 110 or outside of the memory cell array 110 (for example, a peripheral circuit area).

The comparator COMP may compare the second voltage V2 with the reference voltage VREF, and generate the comparison result as the reference time signal EN. The comparator COMP may be formed of a differential amplifier, and may have the same structure as that of the sense amplifier SAMP.

When the voltage level of the second voltage V2 rises higher than the reference voltage VREF, the comparator COMP may generate the reference time signal EN of a first logic level, for example, logic high. The sensing circuit 141a may output the sensing result in response to the reference time signal EN.

In addition, in order to determine the data of the memory cell MC, the reference time signal EN has to be activated in a time section between a point when an output from the sense amplifier SAMP is changed when the memory cell MC is in the set state (e.g., a point at which the voltage level of the first voltage V1 is greater than the reference voltage VREF) and a time point when the output from the sense amplifier SAMP is changed when the memory cell MC is in the reset state. To do this, the current value of the second reference current IREF2 may be adjusted by using following equation. Here, Rref denotes a threshold resistance level for distinguishing the set state and the reset state of the memory cell MC from each other, as described above with reference to FIG. 6A.

The first voltage V1 of the sensing circuit 141a may be calculated by Equation 1.

$$V_1 = \frac{IREF1 \cdot R_{CELL} + V_{thd}}{R_{CELL} \cdot C1 + t} \cdot t \quad (1)$$

Here, $V_{thd}$ denotes a threshold voltage of a diode in the memory cell MC and t denotes elapsed time.

The second voltage V2 of the reference time generator 142a may be calculated by Equation 2.

$$V_2 = \frac{\alpha \cdot IREF1 \cdot t}{C2} \quad (2)$$

When it is assumed that the capacitance of the first capacitor C1 and the capacitance of the second capacitor C2 are equal to each other, the reference time $t_{REF}$ when the cell resistance $R_{CELL}$ of the memory cell MC is the threshold resistance level Rref and the voltage levels of the first voltage V1 and the second voltage V2 are equal to each other may be represented by Equation 3, with reference to Equation 1 and Equation 2.

$$t_{REF} = C \cdot \left[ \left( \frac{1}{\alpha} - 1 \right) \cdot Rref + \frac{V_{thd}}{\alpha \cdot IREF1} \right] \quad (3)$$

In addition, in order to calculate the reference voltage VREF having the same voltage level as that of the second voltage V2 at the reference time $t_{REF}$, Equation 4 may be obtained by substituting Equation 3 in Equation 2.

$$VREF=(1-\alpha) \cdot IREF1 \cdot Rref + V_{thd} \quad (4)$$

The reference voltage VREF may be set to be irrelevant with the capacitor, and the reference voltage VREF may be adjusted according to a value of α. On the contrary, the current value of the second reference current IREF2, may be determined in a state where the reference voltage VREF and the threshold resistance level Rref are determined based on Equation 4.

The sensing circuit associated with a current sensing approach may sense data in a state where charging of the capacitor is finished and the voltage at the sensing node is stable. If the reference current supplied to the signal line (e.g., a bit line) is increased in order to reduce charging time for the capacitor, the voltage level at the time point at which the voltage on the bit line is stabilized becomes greater. Thus, the reference voltage has to increase and current consumption also increases. On the contrary, if the reference current is decreased, the voltage level at the time point at which the voltage on the bit line is stable is reduced, but the time required to charge the capacitor increases and therefore overall sensing time increases.

However, according to the read circuit 140a of FIG. 8, the reference time generator 142a provides the reference time for classifying the resistance state of the memory cell MC, and the data is sensed based on the reference time before stabilizing the voltage level of the bit line. Therefore, the sensing time and the current consumption may be decreased, and the sensing margin may be increased. Also, the data may be sensed without regard to variations in signal line capacitance caused by changes in environment/process/temperature. As a result, data may be stably read despite reductions in power consumption.

Figure 9:
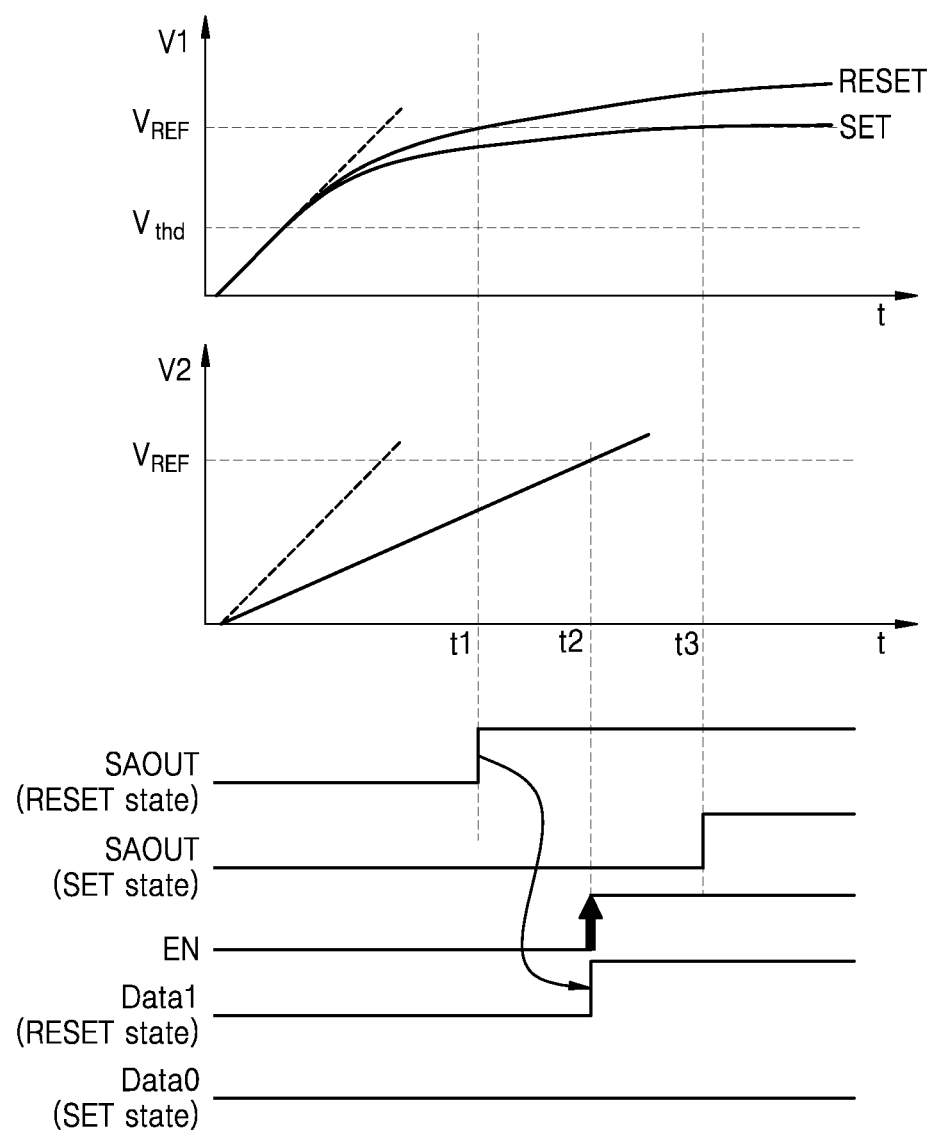
FIG. 9 is a diagram showing variation in resistance distribution of memory cells.

FIG. 9 is a set of graphs and signal waveform diagrams further illustrating the operation of the read circuit 140a of FIG. 8. In FIG. 9, it is assumed that the capacitance of the first capacitor C1 of the sensing circuit 141a and the capacitance of the second capacitor C2 of the reference signal generator 142a are equal to each other.

Referring to FIG. 9, when execution of a read operation begins, the level of the first voltage V1 increases at a predetermined slope. Here, when the level of the first voltage V1 is equal to or greater than the threshold voltage Vthd of the diode in the memory cell MC, the diode of the memory cell MC is turned ON, and the cell current $I_{CELL}$ flows according to the resistance state of the memory cell MC. Therefore, the rate (or speed) with which the level of the first voltage V1 increases is reduced. Since the cell current $I_{CELL}$ when the memory cell MC is in the set state is greater than that when the memory cell MC is in the reset state, the rate at which the level of the first voltage V1 increases in the set state is slower than the rate at which the level of the first voltage V1 increases in the reset state. Accordingly, when the memory cell MC is in the reset state, the voltage level of the first voltage V1 becomes greater than the reference voltage VREF at a first time t1, and an output from the sense amplifier (SAOUT) is a logical 'high'. When the memory cell MC is in the set state, the level of the first voltage V1 becomes greater than the reference voltage VREF at a third time t3 that follows the first time t1, and the output of the sense amplifier (SAOUT) transitions to a high. However, since the sense amplifier SAMP outputs the comparison result as data in response to the reference time signal EN, when the reference time signal EN is activated, the output from the sense amplifiers (SAOUT) may be output as data.

In addition, since the current value of the second reference current IREF2 is less than that of the first reference current IREF1, the increasing speed of the second voltage V2 is lower than that of the first voltage V1 at an initial stage of the sensing operation. However, the second voltage V2 increases at a constant speed, and the voltage level of the second voltage V2 becomes greater than the reference voltage VREF at a second time t2. Accordingly, the reference time signal EN may be activated at the second time t2.

Accordingly, at the second time t2 when the reference time signal EN is activated, the data of the memory cell MC is output. If the memory cell MC is in the reset state (e.g., Data 1) a high is output, but if the memory cell MC is in the set state (e.g., Data 0) a low is output.

Figure 10:
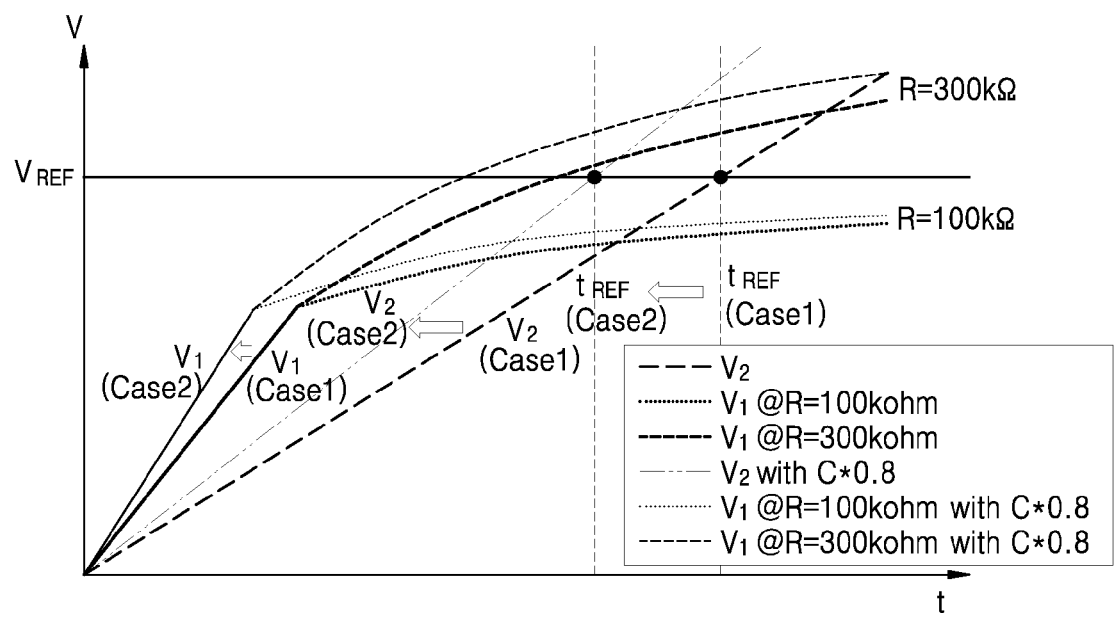
FIG. 10 is a graph of a voltage and a signal of the read circuit of FIG. 8.

FIG. 10 is a graph illustrating voltage relationships related to the operation of the read circuit 140a of FIG. 8 in relation to conditions wherein the capacitance of the capacitor is reduced.

In FIG. 10, Case 1 assumes that the first voltage V1 and second voltage V2 are nominal, while Case 2 assumes that the first voltage V1 and second voltage V2 are defined in part by a 20% reduction in the capacitance associated with the nominal case due to a change in environment/process/temperature. The nominal reset state resistance R for the memory cell MC is assumed to be 300 kΩ and a nominal set state resistance R for the memory cell MC is assumed to be 100 kΩ.

As shown in Case 2 of FIG. 10, the increasing rate with which the level of the first voltage V1 rises is faster for the set state due to the reduction in the capacitance of the capacitor. However, the increasing rate with which the level of the second voltage V2 rises also becomes faster. Thus, the corresponding data sensing margin is maintained, and sensing time is reduced.

Accordingly a read circuit like the read circuit 140a of FIG. 8 provides a reference time that appropriately varies in relation to changes in the capacitance of a signal line capacitor. Hence, data may be stably sensed even in the face of a changing capacitance.

Figure 11:
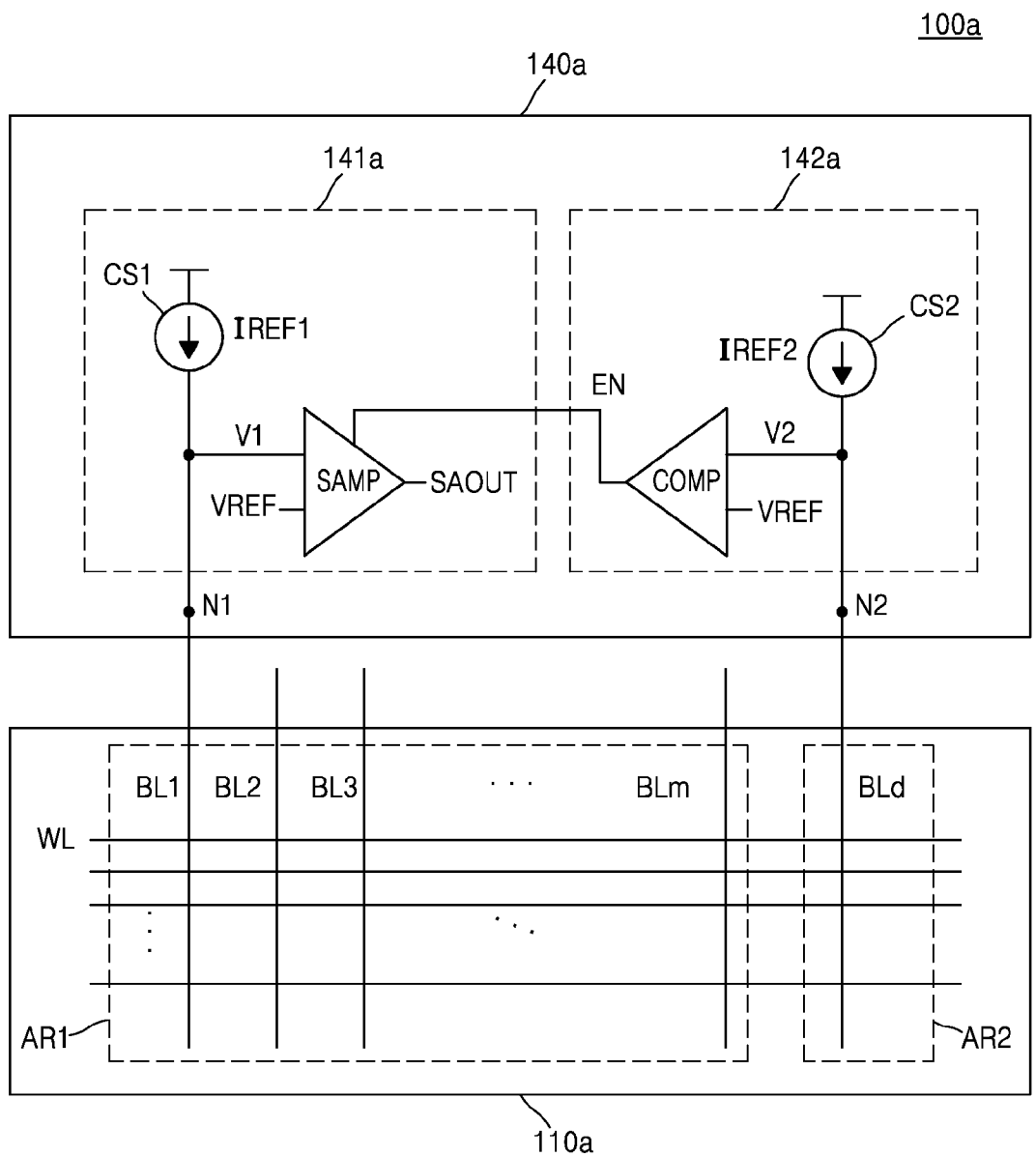
FIG. 11 is a circuit diagram of a memory device including a read circuit and a memory cell array according to an embodiment of the inventive concept.

FIG. 11 is a circuit diagram illustrating a memory device 100a including the read circuit 140a of FIG. 8 along with the memory cell array 110a according to an embodiment of the inventive concept. Thus, FIG. 11 illustrates an example in which the read circuit 140a is configured together with the memory cell array 110a.

The memory cell array 110a is assumed to include a first area AR1 and a second area AR2, where the second area AR2 is a dummy area including dummy memory cells connected with dummy signal lines (e.g., dummy bit lines BLd).

In the illustrated example, the read circuit 141a is connected to a first bit line BL1 in order to sense data stored in a selected memory cell MC connected to the first bit line BL1, and the first capacitor C1 of FIG. 8 is assumed as a parasitic capacitor associated with the bit line BL1. In like manner, the reference time generator 142a is assumed to be connected to a dummy bit line BLd, and the second capacitor C2 of FIG. 8 is assumed as a parasitic capacitor associated with the dummy bit line BLd.

If the capacitance of the overall capacitor changes according to environment/process/temperature, the capacitance of the first capacitor C1 connected to the sensing circuit 141a and the capacitance of the second capacitor C2 connected to the reference time generator 142a will change in similar manner given the assumption that these two capacitances are substantially equal. Therefore, the read circuit 140a may stably read data stored in the memory cell MC even when the overall signal line capacitance is changes.

Figure 12:
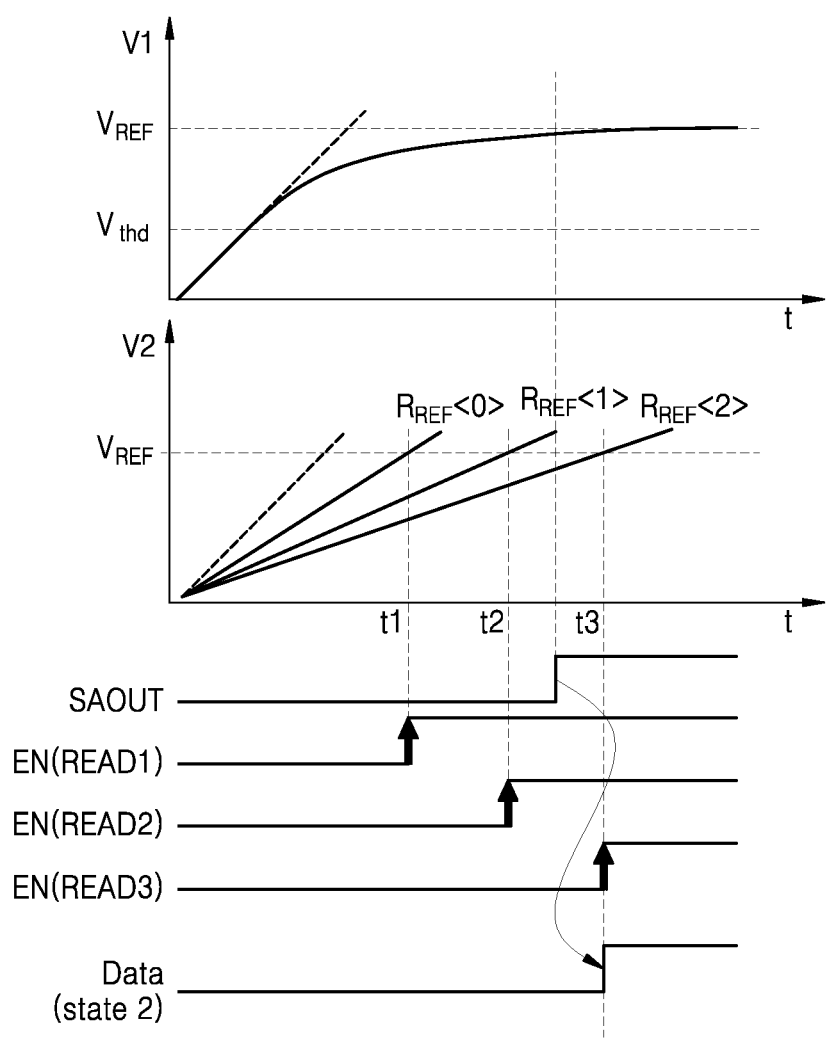
FIG. 12 is a graph showing multi-bit sensing of the read circuit in FIG. 8.
Figure 13:
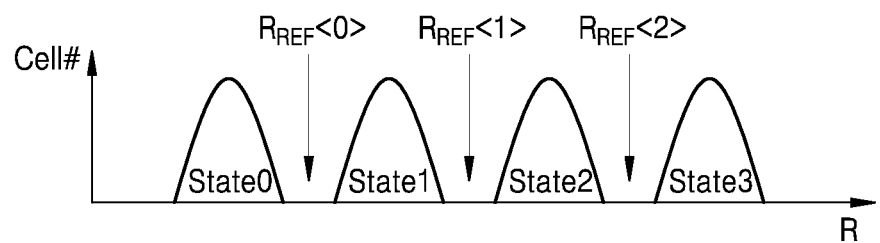
FIG. 13 is a diagram showing a status of a memory cell according to data output from the read circuit of FIG. 8 when a plurality of read operations are performed.

FIG. 12 is another set of graphs and waveform diagrams illustrating multi-bit sensing by the read circuit 140a of FIG. 8. FIG. 13 is a diagram illustrating various memory cell states as a function of different read operations performed by the read circuit 140a of FIG. 8.

Referring to FIG. 12, the read circuit 140a is assumed to execute at least two read operations in order to determine at least three data (or memory cell resistance) states for the memory cell MC. The reference signal generator 142a generates the reference time signal EN at least twice, and the sensing circuit 141a provides corresponding sensing results at least twice in response to the reference time signals EN. The state of the memory cell MC may be determined according to the sensing result provided by execution of the read operation, as illustrated by FIG. 13.

Here, the current value of the second reference current IREF2 may be differentiated according to a number of times that the read operation is executed so that the time at which the reference time signal EN is generated may be differently set. When the read operation is performed on the memory cell MC, the value of the second reference current IREF2 may be adjusted to correspondingly adjust the time at which the reference time signal EN is generated. That is, the time at which the reference time signal EN is activated may be appropriately adjusted. Based on Equations 3 and 4 above, the value of the second reference current IREF2 (i.e., the value of 'α') may be calculated.

For example, the value 'α' may be controlled by adjusting it so that the reference time signal EN is activated at the first time t1 during a first read operation READ1, so that the reference time signal EN is activated at the second time t2 during a second read operation READ2, and so that the reference time signal EN is activated at the third time t3 during a third read operation READ3. Accordingly, the resistance state of the memory cell MC may be determined based on a first threshold resistance level ($R_{REF}$<0>) when the first read operation READ1 is performed, based on the second threshold resistance level ($R_{REF}$<1>) when the second read operation READ2 is performed, and based on the third threshold resistance level ($R_{REF}$<1>) when the third read operation READ3 is performed.

FIG. 12 illustrates an example wherein four (4) states (i.e., State0, State1, State2 and State3) for the memory cell MC are determined by executing three successive read operations.

Referring to FIG. 13, the state of the memory cell MC may be determined based on read data provided by each of the successively executed read operations READ1, READ2 and READ3.

For example, when the output SAOUT from the sense amplifier is Data1 (or a high) in each of the first, second and third read operations READ1, READ2 and READ3, the data state of the memory cell MC is determined to be the first state (State0), and if Data0 (or a low) is output by the first read operation READ1 and Data1 is output by the second read operation READ2, the data state of the memory cell MC is determined to be the second state (State1). If the output SAOUT of the sense amplifier in response to the first and second read operations READ1 and READ2 is Data0 and the output SAOUT of the sense amplifier in response to the third read operation READ3 is Data0, the data state of the memory cell MC is determined to be the third state (State2) and if Data0 is output in response to the first, second and third read operations READ1, READ2 and READ3, the data state of the memory cell MC is determined to be the fourth state (State3).

Referring back to FIG. 12, the level of the first voltage V1 is greater than that of the reference voltage VREF during an interval between the second time t2 and the third time t3. Accordingly, the output SAOUT of the sense amplifier transitions to a high during this interval, and Data1 is output in response to the third read operation READ3. Therefore, the data state of the memory cell MC is determined to be the third state (State2).

Figure 14:
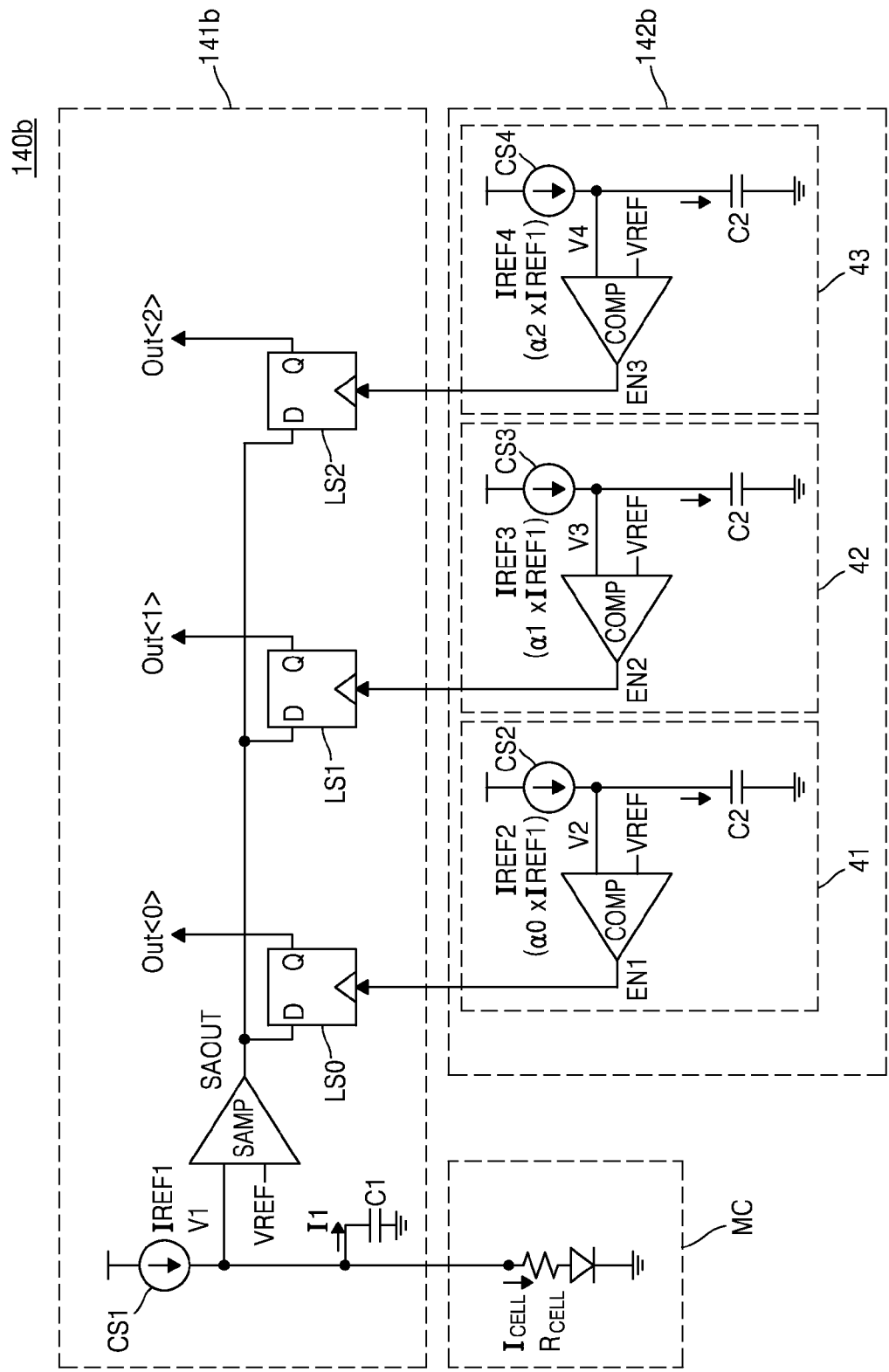
FIG. 14 is a circuit diagram of a read circuit according to another embodiment of the inventive concept.

FIG. 14 is a circuit diagram illustrating a read circuit 140b according to another embodiment of the inventive concept. The read circuit 140b is drawn to an example wherein a memory cell MC that may be programmed to at least three states is read during a read operation.

Referring to FIG. 14, the read circuit 140b includes the sensing circuit 141b and a reference time generator 142b, where the reference time generator 142b may be used to generate a plurality of reference time signals EN1 to EN3 and provide the sensing circuit 141b with the reference time signals EN1 to EN3.

The sensing circuit 141b may include the first current source CS1, the first capacitor C1, the sense amplifiers SAMP, and a plurality of latches LS0 to LS2, and may sense the data stored in the memory cell MC according to the current sensing method.

As described above with reference to FIG. 8, since the increasing speed of the first voltage V1 varies depending on the state of the memory cell MC, the state of the memory cell MC may be determined based on a result of comparing the first voltage V1 with the reference voltage VREF at a reference time point.

The sensing circuit 141b according to the illustrated embodiment of FIG. 14 applies the output SAOUT of the sense amplifier to the plurality of latches LS0 to LS2, and each of the plurality of latches LS0 to LS2 outputs the data in response to the plurality of reference time signals EN1, EN2, and EN3 representing different reference times from each other. Thus, the sensing data of the memory cell MC may be output on at least two time points.

In FIG. 14, the sensing circuit 141b includes three latches LS0, LS1, and LS2, and outputs three pieces of output data (Out<0>, Out<1>, and Out<2>). However, one or more embodiments are not limited thereto, that is, the sensing circuit 141b may include at least two latches and output at least two pieces of output data.

In addition, the reference time generator 142b includes a plurality of reference time generation circuits 41, 42, and 43 to generate the plurality of reference time signals EN1, EN2, and EN3. Each of the reference time generation circuits 41, 42, and 43 may include the second capacitor C2, the comparator COMP, and current sources CS2, CS3, and CS4. Operations of the plurality of reference time generation circuits 41, 42, and 43 are similar to that of the reference time generator 142a described above with reference to FIG. 8, and detailed descriptions thereof are omitted.

The current sources CS2, CS3, and CS4 included in the reference time generation circuits 41, 42, and 43 may generate reference currents IREF2, IREF3, and IREF4 having different current values from each other, based on the first reference current IREF1. The second current source CS2 may generate the second reference current IREF2 that is $\alpha 0$ ($0<\alpha 0<1$) times greater than the first reference current IREF1. The third current source CS3 may generate the third reference current IREF3 that is $\alpha 1$ ($0<\alpha 1<1$) times greater than the first reference current. The fourth current source CS4 may generate the fourth reference current IREF4 that is $\alpha 2$ times greater than the first reference current IREF1 ($0<\alpha 2<1$). Values of $\alpha 0$, $\alpha 1$, and $\alpha 2$ may be different from each other, and in one embodiment, $\alpha 0$ may have the largest value and $\alpha 2$ may have the smallest value. The values of $\alpha 0$, $\alpha 1$, and $\alpha 2$ may be calculated based on the above Equations 3 and 4, in consideration of the threshold resistance level for distinguishing the resistance states of the memory cell MC and the reference voltage VREF.

Since the current values of the reference currents IREF2, IREF3, and IREF4 for charging the second capacitor C2 are different from each other, increasing speeds of the second voltage V2, a third voltage V3, and a fourth voltage V4 are different from each other. Therefore, the first to third reference time signals EN1, EN2, and EN3 may be activated at different time points from each other, and the sensing circuit 141b may output a plurality pieces of output data Out<0>, Out<1>, and Out<3> as a result of sensing at a plurality of time points, for example, three points, in response to the first to third reference time signals EN1, EN2, and EN3.

Figure 15:
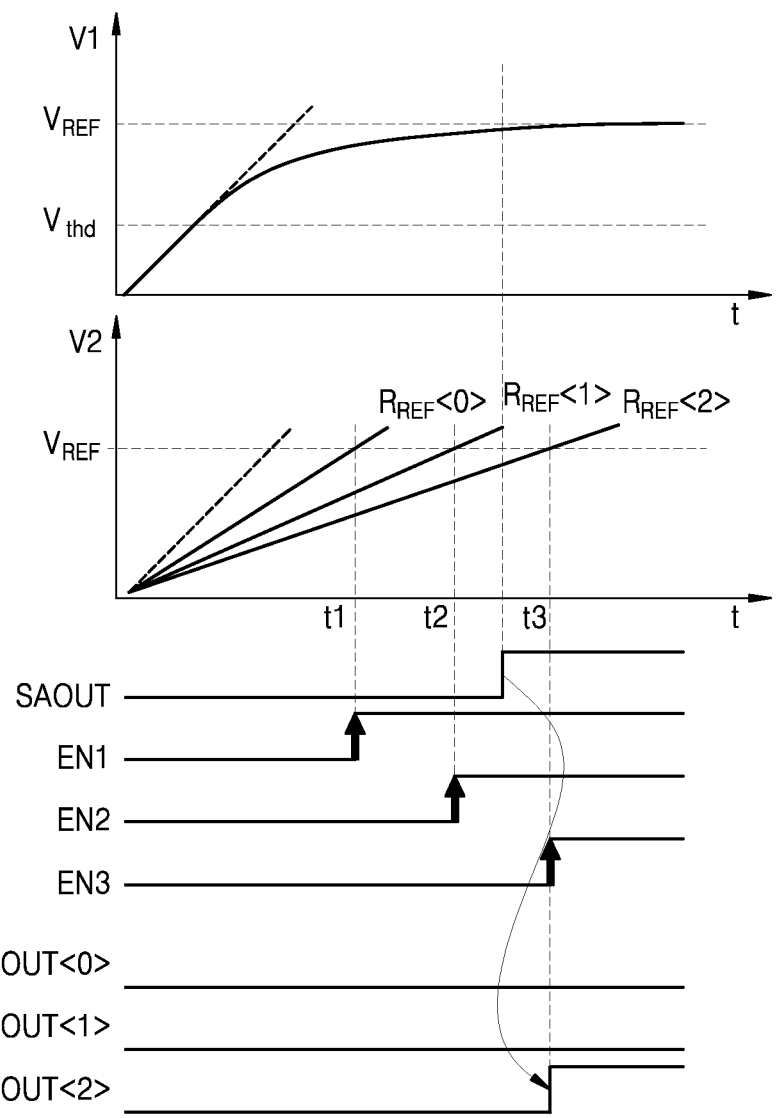
FIG. 15 is a graph of a multi-bit sensing of the read circuit of FIG. 14.
Figure 16:
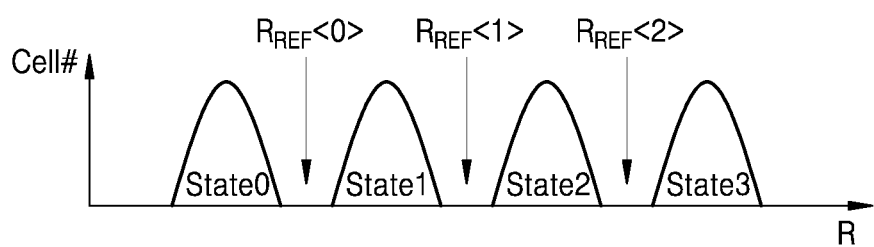
FIG. 16 is a diagram showing a status of a memory cell according to data output from the read circuit of FIG. 14 when a read operation is performed.

FIG. 15 is still another set of graphs and signal waveforms illustrating multi-bit sensing by the read circuit 140b of FIG. 4. FIG. 16 illustrates states for the memory cell MC according to the data output from the read circuit 140b of FIG. 14 when performing the read operation.

Referring to FIG. 15, the output SAOUT from the sense amplifier SAMP of FIG. 14 may provide the result of comparing the first voltage V1 with the reference voltage VREF to the first to third latches LS0 to LS2. The first to third latches LS0 to LS2 may output first to third output data OUT<0>, OUT<1>, and OUT<3> in response to the first to third reference time signals EN1, EN2, and EN3.

In addition, the first reference time generation circuit 41 outputs the first reference time signal EN1 that is activated at the first time t1, and the first latch LS0 may output the first output data OUT<0> based on the first reference time signal EN1. The first output data OUT<0> is the output SAOUT from the sense amplifier SAMP at the first time t1, and represent the sensing result at t1.

The second reference time generation circuit 42 outputs the second reference time signal EN2 that is activated at the second time t2, and the second latch LS1 may output the second output data OUT<1> based on the second reference time signal EN2.

The third reference time generation circuit 43 outputs the third reference time signal EN3 that is activated at the third time t3, and the third latch LS2 may output the third output data OUT<2> based on the third reference time signal EN3.

Since the output SAOUT of the sense amplifier SAMP is changed between the second time t2 and the third time t3, the third latch LS2 may output Data1 as the third output data OUT<2>.

FIG. 16 shows an example wherein four states State0 to State3 of the memory cell MC may be determined according to the output data. However, one or more embodiments of the inventive concept are not limited thereto, and the read circuit 140b may output at least two pieces of output data, that is, output data of two-bits, and may distinguish at least three states based on the output data.

Referring to FIG. 16, if the first to third output data OUT<0>, OUT<1>, and OUT<2> are Data0, the data state of the memory cell MC is determined as the first state (State0). If the first and second output data OUT<0> and OUT<1> are Data0 and the third output data OUT<3> is Data1, the data state of the memory cell MC is determined as the second state (State1). If the first output data OUT<0> is Data0 and the second and third output data OUT<1> and OUT<2> are Data1, the data state of the memory cell MC is determined as the third state (State2). If the first to third output data OUT<0>, OUT<1>, and OUT<2> are Data1, the data state of the memory cell MC is determined as the fourth state (State3).

In the illustrated example of FIG. 15, the first and second output data OUT<0> and OUT<1> are Data0 and the third output data OUT<2> is Data1. Thus, the data state of the memory cell MC may be determined as the second state (State1) under the foregoing assumptions.

Figure 17:
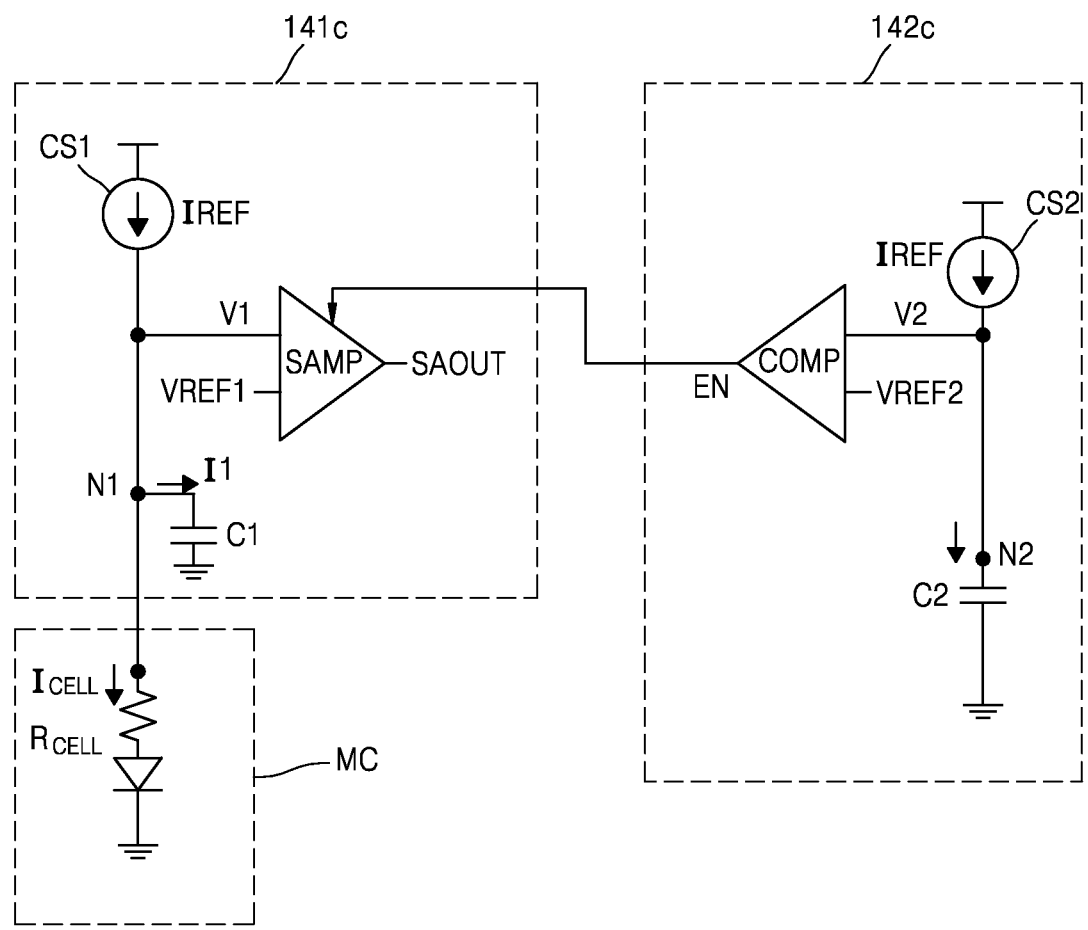
FIG. 17 is a circuit diagram of a read circuit according to another embodiment of the inventive concept.

FIG. 17 is a circuit diagram illustrating a read circuit 140c according to another embodiment of the inventive concept.

Referring to FIG. 17, the read circuit 140c includes a sensing circuit 141c and a reference signal generator 142c. The respective structure and operation of the sensing circuit 141c and reference signal generator 142c are substantially similar to those of the sensing circuit 141a and reference signal generator 142a described with reference to FIG. 8, except that the reference signal generator 142c includes the second current source CS2 used to provide the reference current IREF that is equal to the reference current IREF output from the first current source CS1 of the sensing circuit 141c. If the first capacitor C1 and the second capacitor C2 have approximately the same capacitance, the increasing speeds of the first voltage V1 and the second voltage V2 are equal to each other provided that the first voltage V1 is equal to or less than the threshold voltage Vthd of the memory cell MC.

However, the reference signal generator 142c applies a second reference voltage VREF2 having a voltage level that is different from that of the first reference voltage VREF1 applied to the sense amplifier SAMP of the sensing circuit 141c to the comparator COMP so as to control the point when the reference time signal EN is activated. Here, the voltage level of the second reference voltage VREF2 applied to the compactor COMP may be higher than that of the first reference voltage VREF1. The voltage level of the second reference voltage VREF2 may be calculated by using Equation 4, in consideration of the threshold resistance level for distinguishing the states of the memory cell MC.

Figure 18:
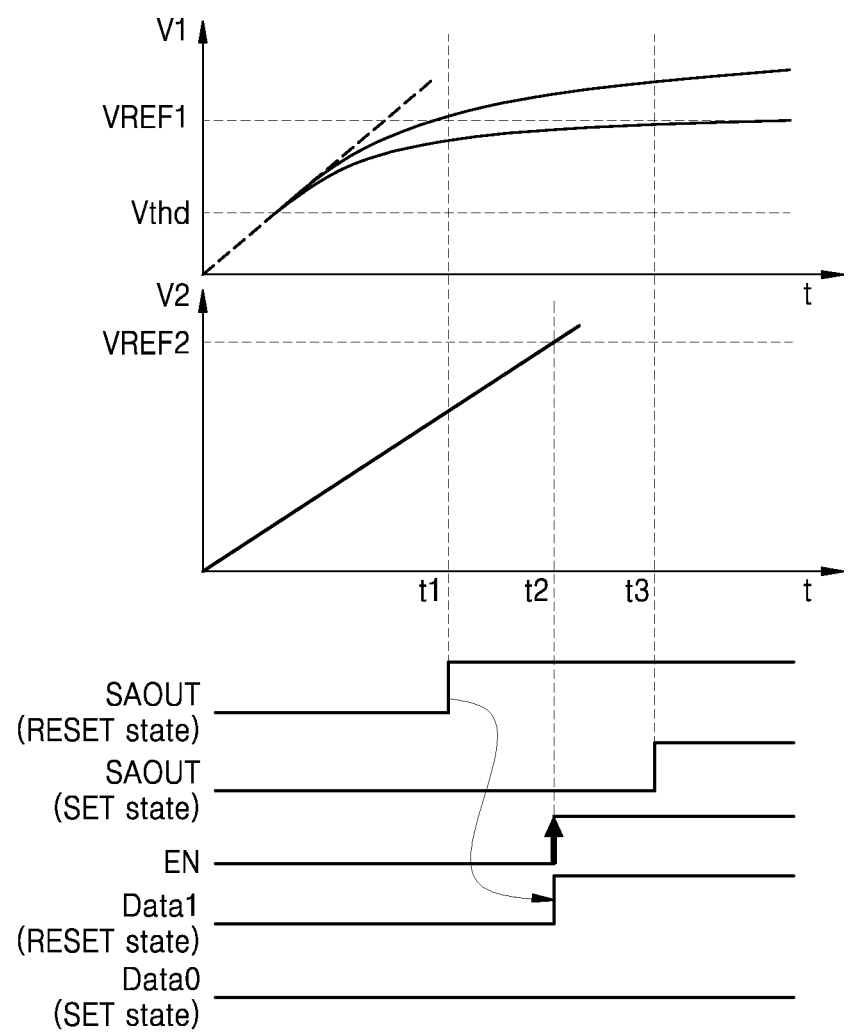
FIG. 18 is a graph of a voltage and a signal of the read circuit of FIG. 17.

FIG. 18 is still another set of graphs and waveform diagrams further illustrating the operation of the read circuit 140c of FIG. 17. FIG. 18 illustrates a particular example wherein the first capacitor C1 of the sensing circuit 141c and the second capacitor C2 of the reference signal generator 142c have about the same capacitance.

Referring to FIG. 18, when the data reading starts, the voltage level of the first voltage V1 increases at a predetermined inclination. Here, when the voltage level of the first voltage V1 becomes equal to or greater than the threshold voltage Vthd of the diode, the diode of the memory cell MC is turned on, and the cell current Icell flows according to the resistance state of the memory cell MC. Thus, the increasing speed of the first voltage V1 decreases. Since the cell current Icell when the memory cell MC is in the set state is greater than the cell current Icell when the memory cell MC is in the reset state, the increasing speed of the first voltage V1 in the set state is less than that of the first voltage V1 in the reset state. Accordingly, when the memory cell MC is in the reset state, the voltage level of the first voltage V1 becomes higher than the first reference voltage VREF1 after the first time t1, and the output SAOUT of the sense amplifier SAMP may enter the logic high. In addition, when the memory cell MC is in the set state, the voltage level of the first voltage V1 becomes greater than the first reference voltage VREF1 after the third time t3 that follows the first time t1, and the output SAOUT of the sense amplifier SAMP may enter the logic high. However, the sense amplifier SAMP outputs the comparison result as the output data in response to the reference time signal EN, and thus, when the reference time signal EN is activated, the output SAOUT of the sense amplifier SAMP is output as the data Data.

In addition, the increasing speed of the second voltage V2 may be equal to that of the first voltage V1 when the voltage level of the first voltage V1 is less than the threshold voltage Vthd of the diode. When the voltage level of the first voltage V1 is equal to or greater than the threshold voltage Vthd of the diode, the increasing speed of the first voltage V1 is lowered, and thus, the voltage level of the second voltage V2 becomes higher than that of the first voltage V1. However, by setting the voltage level of the second reference voltage VREF2 to be greater than that of the first reference voltage VREF1, the reference time signal EN1 may be activated in the time section between t1 and t2.

At the second time t1 when the reference time signal EN is activated, the data of the memory cell MC is output, that is, when the memory cell MC is in the reset state, Data1 is output, and when the memory cell MC is in the set state, Data0 is output.

Figure 19:
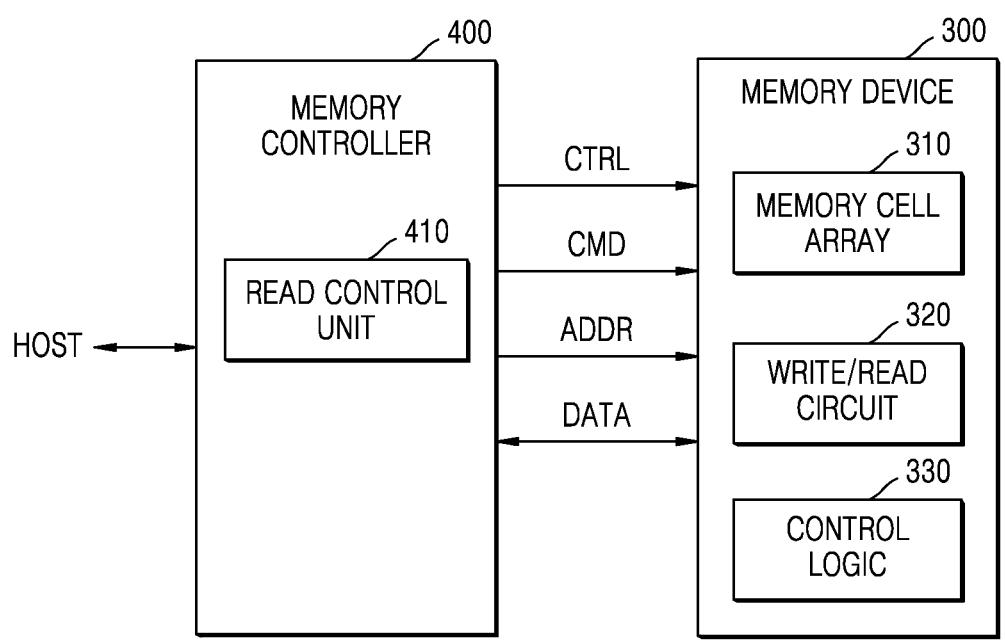
FIG. 19 is a block diagram of a memory system including a resistive memory device according to an embodiment of the inventive concept.

FIG. 19 is a block diagram illustrating a memory system 20 including a resistive memory device according to an embodiment of the inventive concept.

Referring to FIG. 19, the memory system 20 includes a memory device 300 and a memory controller 400, where the memory device 300 includes a memory cell array 310, a write/read circuit 320, and a control logic 330. A read circuit (e.g., read circuit 140 of FIG. 7) according to the embodiments of the inventive concept described above with reference to FIGS. 7 to 18 may be applied to the write/read circuit 320 of the present embodiment.

The memory controller 400 may include a read control unit 410. The read control unit 410 may transmit a control signal CTRL for controlling the read operation of the read circuit 140 to the memory device 300. The read control unit 410 evaluates the resistance distribution of the memory cells based on a writing result or a reading result, and may provide the control signal CTRL for determining the reading conditions, for example, the reference voltage and the reference current, for increasing the sensing margin based on the analysis result, to the write/read circuit 320 or the control logic 330.

Figure 20:
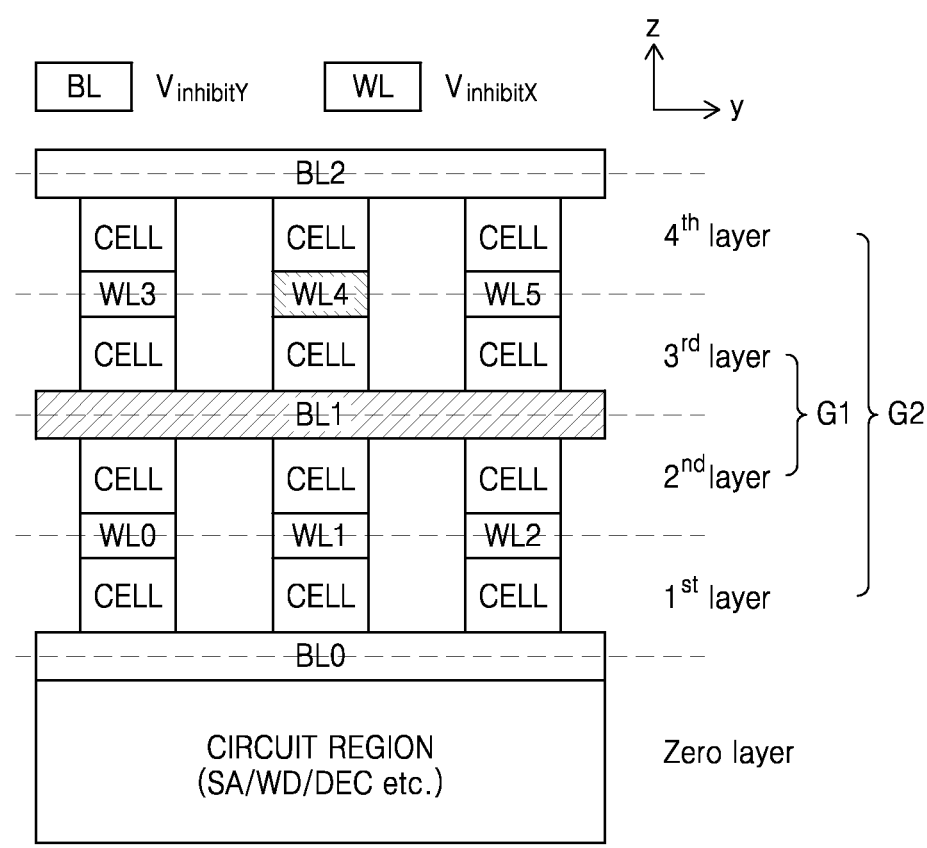
FIG. 20 is a diagram showing an example of a memory device according to an embodiment of the inventive concept.

FIG. 20 is a cross-sectional diagram illustrating of a memory device according to an embodiment of the inventive concept.

Referring to FIG. 20, the memory device of the present embodiment may be a three-dimensional (3D) cross point memory. For example, a selected bit line may be BL1 and a selected word line may be WL4. Accordingly, operations such as a writing, a reading, and an erasing operation, may be performed on the memory cell that is disposed on a region where the selected bit line BL1 and the selected word line WL4 cross each other, and an operating voltage or an operating current may be applied to the selected bit line BL1 and the selected word line WL4. A column inhibit voltage VinhibitY is applied to unselected bit lines BL0 and BL2, and a row inhibit voltage VinhibitX may be applied to unselected word lines WL0, WL1, WL2, WL3, and WL5.

In the illustrated embodiment of FIG. 20, memory cells arranged in a second layer and a third layer adjacent to the selected bit line BL1, to which the operating voltage or the operating current is applied, may be classified as a first cell region G1, and memory cells arranged in a first layer and a fourth layer may be classified as a second cell region G2. In addition, the read operations may be performed independently according to first and second reading references REF1 and REF2 corresponding to the first and second cell regions G1 and G2.

The 3D cross-point memory according to the present embodiment may be applied to the memory device 100 or 100a according to the above described embodiments. In addition, in the read circuit 140, 140a, 140b, 140c, or 140d according to the above described embodiments with reference to FIGS. 7 to 18, the first capacitor C1 may be a parasitic capacitor existing in the selected bit line BL1 or the selected word line WL4. Also, the second capacitor C2 may be a parasitic capacitor existing in the unselected bit lines BL0 and BL2.

According to another embodiment, the first and second capacitors C1 and C2 may be separately disposed on a circuit region.

Figure 21:
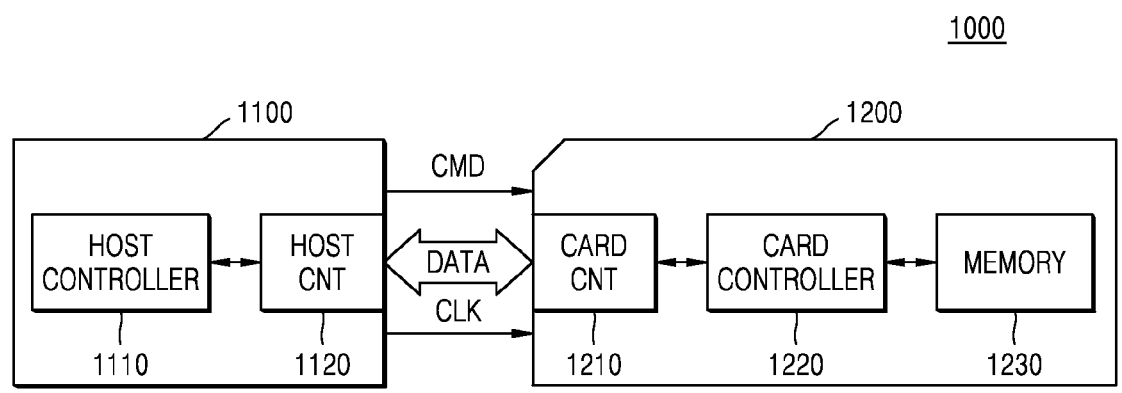
FIG. 21 is a block diagram of a memory card system to which a memory system according to an embodiment of the inventive concept is applied.

FIG. 21 is a block diagram illustrating a memory card system 1000 having a memory system applied thereto, according to an embodiment of the inventive concept.

Referring to FIG. 21, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the embodiments shown in FIGS. 1 through 20.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive.

Figure 22:
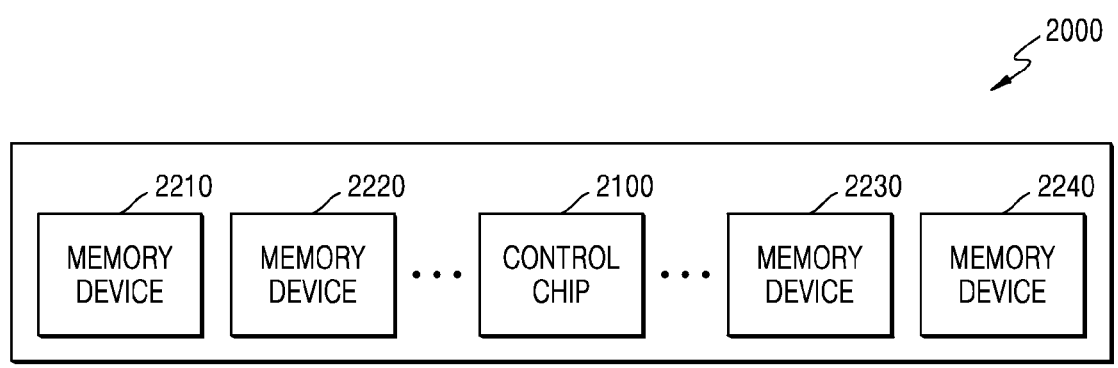
FIG. 22 is a diagram of a resistive memory module according to an embodiment of the inventive concept.

FIG. 22 is a diagram illustrating a resistive memory module 2000, according to an embodiment of the inventive concept. Referring to FIG. 22, the resistive memory module 2000 may include memory devices 2210 through 2240, and a control chip 2100. Each of the memory devices 2210 through 2240 may be embodied by using the embodiments shown in FIGS. 1 through 20. In response to various signals transmitted by an external memory controller, the control chip 2100 may control the memory devices 2210 through 2240. For example, according to various commands and addresses that are transmitted from an external source, the control chip 2100 may activate the memory devices 2210 through 2240 corresponding to the various commands and addresses and thus may control write and read operations. Also, the control chip 2100 may perform various post processing operations on read data output from each of the memory devices 2210 to 2240, e.g., the control chip 2100 may perform error detection and correction operations on the read data.

Figure 23:
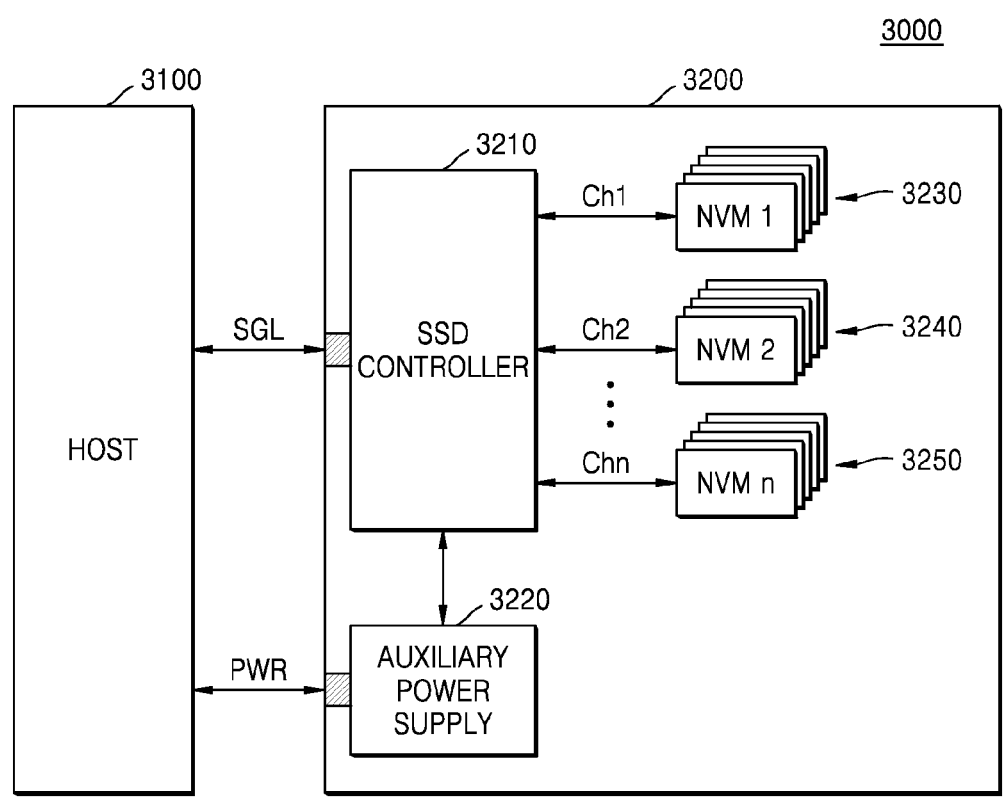
FIG. 23 is a block diagram of a solid state disk (SSD) system to which a memory system according to an embodiment of the inventive concept is applied.

FIG. 23 is a block diagram illustrating a solid state disk/drive (SSD) system 3000 including a memory system applied thereto, according to an embodiment of the inventive concept.

Referring to FIG. 23, the SSD system 3000 may include a host 3100 and an SSD 3200. The SSD 3200 exchanges signals with the host 3100 via a signal connector, and may receive a power input from a power connector. The SSD 3200 includes an SSD controller 3210, an auxiliary power device 3220, and a plurality of memory devices 3230, 3240, and 3250. Here, the SSD 3200 may be embodied by using the embodiments of FIGS. 1 through 21.

Figure 24:
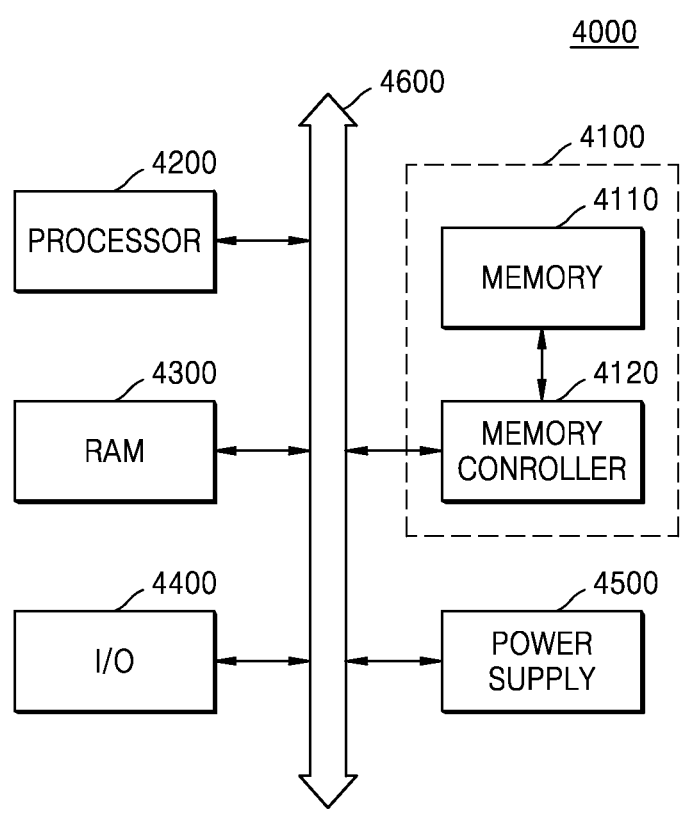
FIG. 24 is a block diagram of a computing system including a memory system according to an embodiment of the inventive concept.

FIG. 24 is a block diagram illustrating a computing system 4000 including a memory system according to an embodiment of the inventive concept.

Referring to FIG. 24, the computing system 4000 may include a memory system 4100, a processor 4200, a RAM 4300, an input/output (I/O) device 4400, and a power supply device 4500. Although not illustrated in FIG. 24, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 may be embodied by using the embodiments shown in FIGS. 1 through 20.

In one or more embodiments, the processor 4200 may also be connected to an extended bus such as a Peripheral Component Interconnect (PCI) bus.

The RAM 4300 may store data for operations of the computing system 4000. As described above, the memory device according to the one or more embodiments of the inventive concept may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the inventive concept has been particularly shown and described with reference to embodiments thereof, it will be understood that various changes in form and details may be made therein without departing from the scope of the following claims.

What is claimed is:

1. A resistive memory device comprising:
   a memory cell array including a memory cell connected to a first signal line and a second signal line;
   a sensing circuit connected to the first signal line, wherein the sensing circuit is configured to sense data stored in the memory cell based on a first reference current flowing through the first signal line; and
   a reference time generator is configured to generate a reference time signal that determines a time at which the sensing of the stored data by the sensing circuit occurs based on the first reference current,
   wherein the sensing circuit comprises
      a first current source configured to provide the first reference current to the first signal line,
      a first capacitor connected to the first signal line, and a sense amplifier configured to compare a first reference voltage with a voltage apparent on the first signal line in response to the reference time signal,
wherein the reference time generator comprises
a second current source configured to generate a second reference current based on the first reference current,
a second capacitor charged by the second reference current, and
a comparator configured to compare a second reference voltage with a voltage of the second capacitor and provide a corresponding comparison result as the reference time signal, and
wherein a time required for the first capacitor to be charged to a level of the first reference voltage in response to the first reference current is less than a time required for the second capacitor to be charged to a level of the second reference voltage in response to the second reference current.

2. The resistive memory device of claim 1, wherein the second current source is configured to provide the second reference current that is a times greater than the first reference current, where $0<\alpha<1$.

3. The resistive memory device of claim 1, wherein a capacitance of the first capacitor and a capacitance of the second capacitor are substantially equal.

4. The resistive memory device of claim 1, wherein the first reference voltage and the second reference voltage are substantially equal.

5. The resistive memory device of claim 1, wherein the second capacitor is a parasitic capacitor associated with the first signal line.

6. The resistive memory device of claim 1, wherein the reference time generator is connected to a first dummy signal line of the memory cell array, and
the second capacitor is a parasitic capacitor associated with the first dummy signal line.

7. The resistive memory device of claim 1, wherein the sensing circuit is configured to sense the data stored in the memory cell by executing a number of read operations, and
the reference time generator is configured to provide the sensing circuit with a plurality of reference time signals by changing a value of the second reference current in accordance with the number of read operations.

8. A resistive memory device comprising:
a memory cell array including a memory cell connected to a first signal line and a second signal line;
a sensing circuit configured to sense multi-level data stored in the memory cell based on a reference current and provide a sensing result in response to at least two reference time signals respectively activated at different times; and
a reference time generator including at least two reference time generation circuits configured to operate in response to the reference current and generate the at least two reference time signals, wherein each one of the at least two reference time generation circuits is configured to generate one of the at least two reference time signals,
wherein each one of the at least two reference time generation circuits is respectively configured to generate one of the at least two reference time signals based on at least two currents generated by reducing the reference current according to two different current reduction ratios.

9. The resistive memory device of claim 8, wherein the sensing circuit comprises:
a first current source configured to provide the reference current to the first signal line;
a sense amplifier configured to compare a reference voltage with a voltage apparent on the first signal line to generate a first comparison result; and
at least two latches configured to receive the first comparison result and provide at least one bit of the multi-level data respectively in response to at least two reference time signals from among the at least two reference time signals.

10. The resistive memory device of claim 9, wherein the at least two latches include a first latch, a second latch, and a third latch,
the first latch configured to provide a first bit of the multi-level data in response to a first reference time signal from the at least two reference time signals,
the second latch configured to provide a second bit data of the multi-level data in response to a second reference time signal from the at least two reference time signals, and
the third latch configured to provide a third bit of the multi-level data in response to a third reference time signal from the at least two reference time signals.

11. A method of operating a resistive memory device including a memory cell array including a memory cell connected to a first signal line and a second signal line, the method comprising:
providing a first reference current to the first signal line, wherein the first signal line is characterized by a first parasitic capacitor;
comparing a first reference voltage with a voltage apparent on the first signal line in response to a reference time signal to sense data stored in the memory cell, wherein the reference time signal is based on the first reference current;
generating a second reference current based on the first reference current;
charging a second parasitic capacitor associated with the second signal line using the second reference current; and
comparing a second reference voltage with a voltage of the second parasitic capacitor to provide a corresponding comparison result as the reference time signal,
wherein a time required for the first parasitic capacitor to be charged to a level of the first reference voltage in response to the first reference current is less than a time required for the second parasitic capacitor to be charged to a level of the second reference voltage in response to the second reference current.

12. The method of claim 11, wherein a capacitance of the first parasitic capacitor and a capacitance of the second parasitic capacitor are substantially equal, and
the first reference voltage and the second reference voltage are substantially equal.

13. The method of claim 11, wherein the second signal line is a dummy signal line of the memory cell array.

* * * * *